(12) United States Patent
Weng et al.

(10) Patent No.: US 12,074,586 B2
(45) Date of Patent: *Aug. 27, 2024

(54) STRUCTURE AND MANUFACTURING METHOD OF SURFACE ACOUSTIC WAVE FILTER WITH BACK ELECTRODE OF PIEZOELECTRIC LAYER

(71) Applicant: Shenzhen Newsonic Technologies Co., Ltd., Shenzhen (CN)

(72) Inventors: Guojun Weng, Shenzhen (CN); Gongbin Tang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,070

(22) Filed: Sep. 16, 2022

(65) Prior Publication Data
US 2023/0188116 A1  Jun. 15, 2023

(51) Int. Cl.
*H03H 9/64* (2006.01)
*H03H 3/08* (2006.01)
(Continued)

(52) U.S. Cl.
CPC ............ *H03H 9/6423* (2013.01); *H03H 3/08* (2013.01); *H03H 9/02897* (2013.01); *H03H 9/059* (2013.01); *H03H 9/1092* (2013.01)

(58) Field of Classification Search
CPC .... H03H 9/6423; H03H 3/08; H03H 9/02897; H03H 9/059; H03H 9/1092; H03H 9/02228; H03H 9/0561; H03H 9/1014; H03H 9/173; H03H 9/64; H03H 3/02; H03H 9/02574; H03H 9/1071
(Continued)

(56) References Cited

U.S. PATENT DOCUMENTS

| | | | |
|---|---|---|---|
| 10,469,053 B2 * | 11/2019 | Omura | H03H 3/08 |
| 2010/0007444 A1 * | 1/2010 | Nordin | H03H 3/08 |
| | | | 29/25.35 |

(Continued)

FOREIGN PATENT DOCUMENTS

| | | | | |
|---|---|---|---|---|
| CN | 114884482 A | 8/2022 | | |
| WO | WO-2022103405 A1 * | 5/2022 | | H03H 3/08 |

OTHER PUBLICATIONS

The International Search Report and the Written Opinion of the International Searching Authority, issued by the International Searching Authority for International Application No. PCT/IB2023/059158 dated Jan. 29, 2024.
(Continued)

*Primary Examiner* — Rakesh B Patel
*Assistant Examiner* — Jorge L Salazar, Jr.
(74) *Attorney, Agent, or Firm* — Finnegan, Henderson, Farabow, Garrett & Dunner, LLP.

(57) ABSTRACT

A surface acoustic wave (SAW) filter includes a bottom substrate, a piezoelectric layer disposed above the bottom substrate, the piezoelectric layer having a bottom surface facing the bottom substrate and a top surface opposite to the bottom surface, a lower cavity disposed below the piezoelectric layer, an interdigital transducer (IDT) disposed on the top surface of the piezoelectric layer, and a back electrode disposed on the bottom surface of the piezoelectric layer, and exposed in the lower cavity.

12 Claims, 53 Drawing Sheets

(51) Int. Cl.
*H03H 9/02* (2006.01)
*H03H 9/05* (2006.01)
*H03H 9/10* (2006.01)

(58) Field of Classification Search
USPC .................................................. 333/193–196
See application file for complete search history.

(56) References Cited

U.S. PATENT DOCUMENTS

| | | |
|---|---|---|
| 2012/0205754 A1 | 8/2012 | Iwamoto |
| 2013/0321100 A1 | 12/2013 | Wang |
| 2019/0074813 A1 | 3/2019 | Zou et al. |
| 2020/0259480 A1 | 8/2020 | Pensala et al. |
| 2022/0094328 A1* | 3/2022 | Chen ........................ H03H 9/15 |
| 2023/0087523 A1 | 3/2023 | Weng |

OTHER PUBLICATIONS

Jan H. Kuypers et al., "Intrinsic temperature compensation of aluminum nitride lamb wave resonators for multiple-frequency references", Frequency Control Symposium, 2008 IEEE International, IEEE, Piscataway, NY, USA, May 19, 2008 (May 19, 2008), pp. 240-249.

* cited by examiner

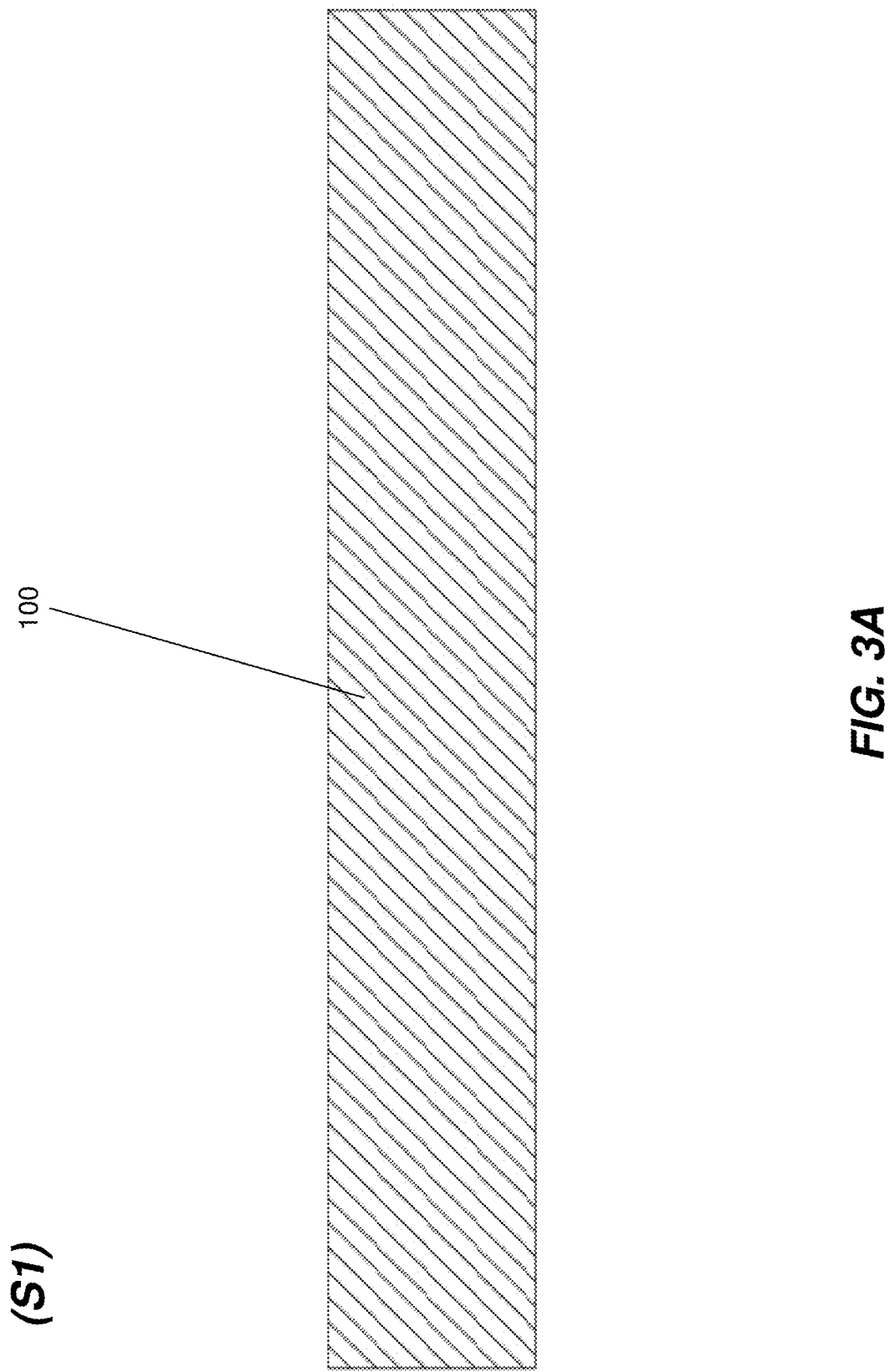

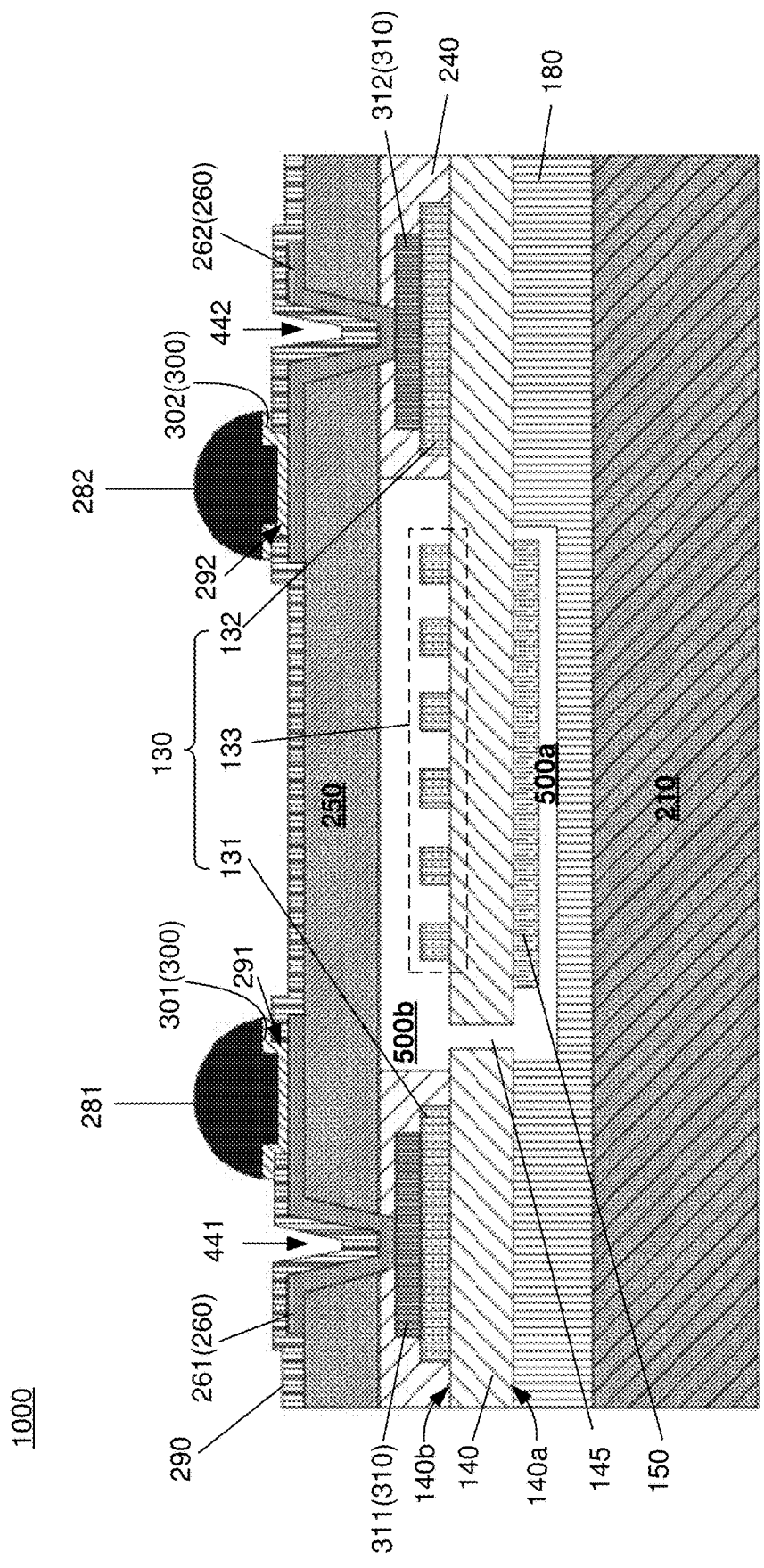

STRUCTURE AND MANUFACTURING METHOD OF SURFACE ACOUSTIC WAVE FILTER WITH BACK ELECTRODE OF PIEZOELECTRIC LAYER

FIELD OF THE DISCLOSURE

The present disclosure relates to the field of semiconductor devices and, in particular, to a surface acoustic wave (SAW) filter structure and a method of fabricating the SAW filter.

BACKGROUND

Surface acoustic wave (SAW) devices, such as SAW resonators and SAW filters, are used in many applications such as radio frequency (RF) filters. A typical SAW filter includes a plurality of interdigital transducers (IDTs) formed on a piezoelectric substrate. The plurality of IDTs are connected in series or in parallel.

As the use of SAW filters in modern RF communication systems increase, there is a need for SAW filters with improved quality factor (Q).

SUMMARY

According to one aspect of the disclosure, a surface acoustic wave (SAW) filter is provided. The SAW filter includes a bottom substrate, a piezoelectric layer disposed above the bottom substrate, the piezoelectric layer having a bottom surface facing the bottom substrate and a top surface opposite to the bottom surface, a lower cavity disposed below the piezoelectric layer, an interdigital transducer (IDT) disposed on the top surface of the piezoelectric layer, and a back electrode disposed on the bottom surface of the piezoelectric layer, and exposed in the lower cavity.

According to another aspect of the disclosure, a SAW filter is provided. The SAW filter includes a bottom substrate, a piezoelectric layer disposed above the bottom substrate, the piezoelectric layer having a bottom surface facing the bottom substrate and a top surface opposite to the bottom surface, a lower cavity disposed below the piezoelectric layer, a back electrode disposed on the top surface of the piezoelectric layer, and an interdigital transducer (IDT) disposed on the bottom surface of the piezoelectric layer, and having an interdigital portion exposed in the lower cavity.

According to one aspect of the disclosure, a fabrication method of a surface acoustic wave (SAW) filter is provided. The method includes: obtaining a piezoelectric substrate; forming a back electrode on a first portion of the piezoelectric substrate; forming a sacrificial layer on the first portion of the piezoelectric substrate, covering the back electrode; forming a first dielectric layer on the first portion of the piezoelectric substrate, covering the sacrificial layer; bonding a bottom substrate to the first dielectric layer; removing a second portion of the piezoelectric substrate to expose the first portion of the piezoelectric substrate, the first portion of the piezoelectric substrate constituting a piezoelectric layer; forming an interdigital transducer (IDT) on the piezoelectric layer; forming one or more release holes through the piezoelectric layer; and etching and releasing the sacrificial layer via the one or more release holes to form a lower cavity exposing the back electrode.

According to another aspect of the disclosure, a fabrication method of a surface acoustic wave (SAW) filter is provided. The method includes: obtaining a piezoelectric substrate; forming an interdigital transducer (IDT) on a first portion of the piezoelectric layer; forming a sacrificial layer on the first portion of the piezoelectric substrate, the sacrificial layer covering an interdigital portion of the IDT; forming a first dielectric layer on the first portion of the piezoelectric substrate, covering the sacrificial layer and the IDT; bonding a bottom substrate to the first dielectric layer; removing a second portion of the piezoelectric substrate to expose the first portion of the piezoelectric substrate, the first portion of the piezoelectric substrate constituting a piezoelectric layer; forming a back electrode on the piezoelectric layer; forming one or more release holes through the piezoelectric layer; and etching and releasing the sacrificial layer to form a lower cavity below the interdigital portion of the IDT.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1A:
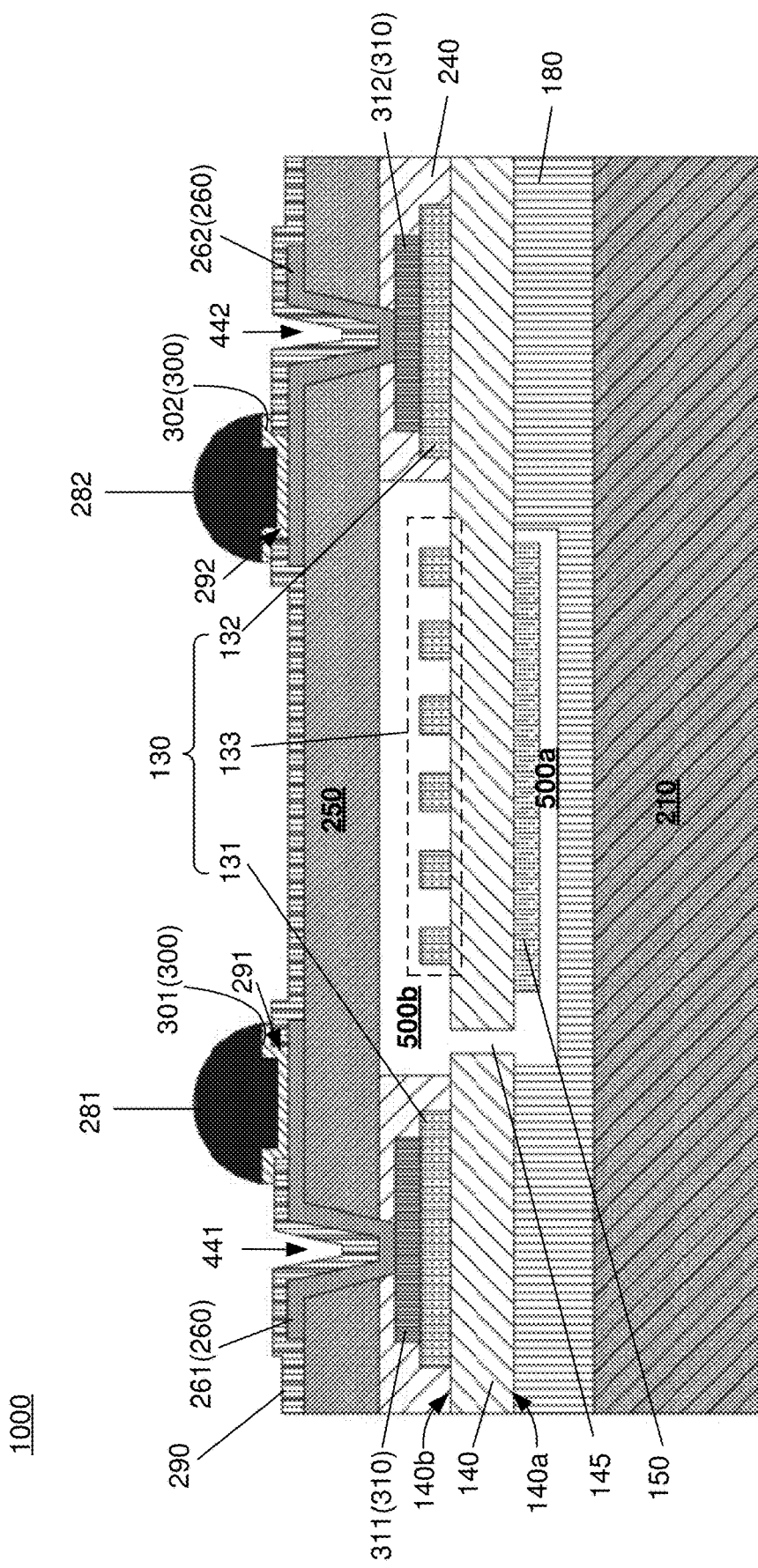
FIG. 1A is a cross-sectional view of a SAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Figure 1B:
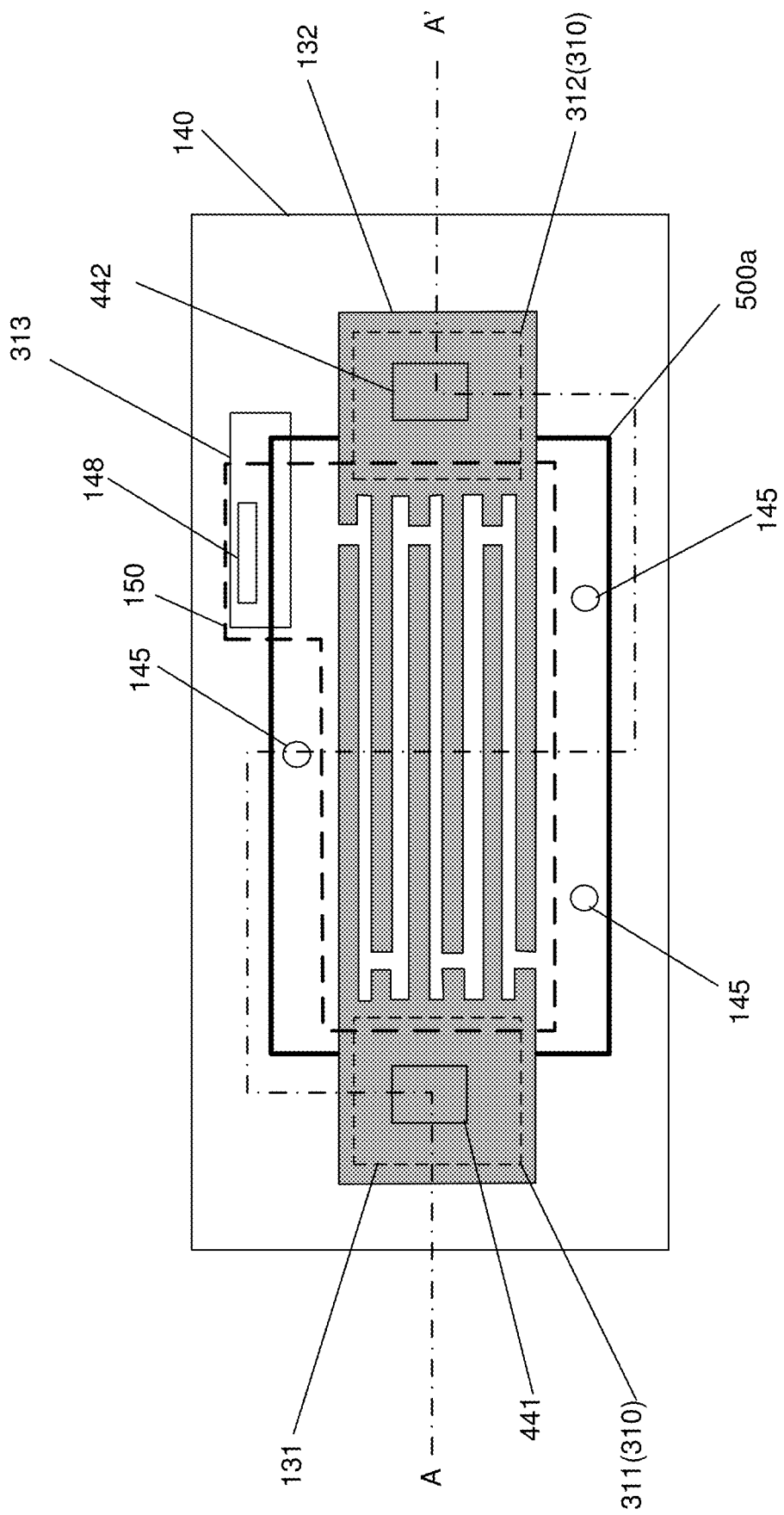
FIG. 1B is a top view showing selected portions of the SAW filter of FIG. 1A, according to an embodiment of the present disclosure.
Figure 1C:
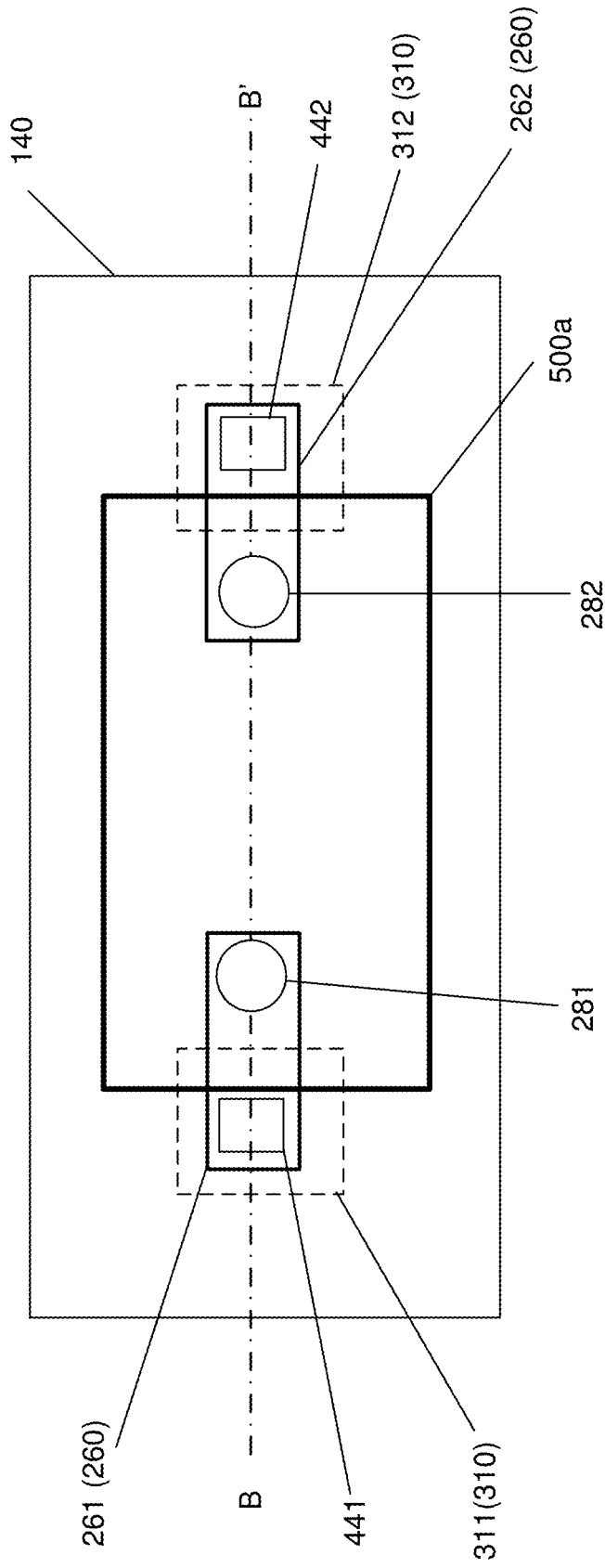
FIG. 1C is a top view showing other selected portions of the SAW filter of FIG. 1A, according to an embodiment of the present disclosure.

FIG. 1A is a cross-sectional view of a SAW filter 1000, according to an embodiment of the present disclosure. FIG. 1B is a top view showing selected portions of SAW filter 1000, according to an embodiment of the present disclosure. A cross section of the selected portions in FIG. 1B along line A-A' is illustrated in FIG. 1A. FIG. 1C is a top view showing other selected portions of SAW filter 1000, according to an embodiment of the present disclosure. A cross section of the selected portions in FIG. 1C along line B-B' is illustrated in FIG. 1A. As illustrated in FIGS. 1A, 1B, and 1C, SAW filter 1000 includes a bottom substrate 210, a piezoelectric layer 140 disposed above bottom substrate 210 and having a bottom surface 140a facing bottom substrate 210 and a top surface 140b parallel with and opposite to bottom surface 140a, a lower cavity 500a disposed below piezoelectric layer 140, an interdigital transducer (IDT) 130 disposed on top surface 140b of piezoelectric layer 140, and a back electrode 150 disposed on bottom surface 140a of piezoelectric layer 140 and exposed in lower cavity 500a.

Figure 1D:
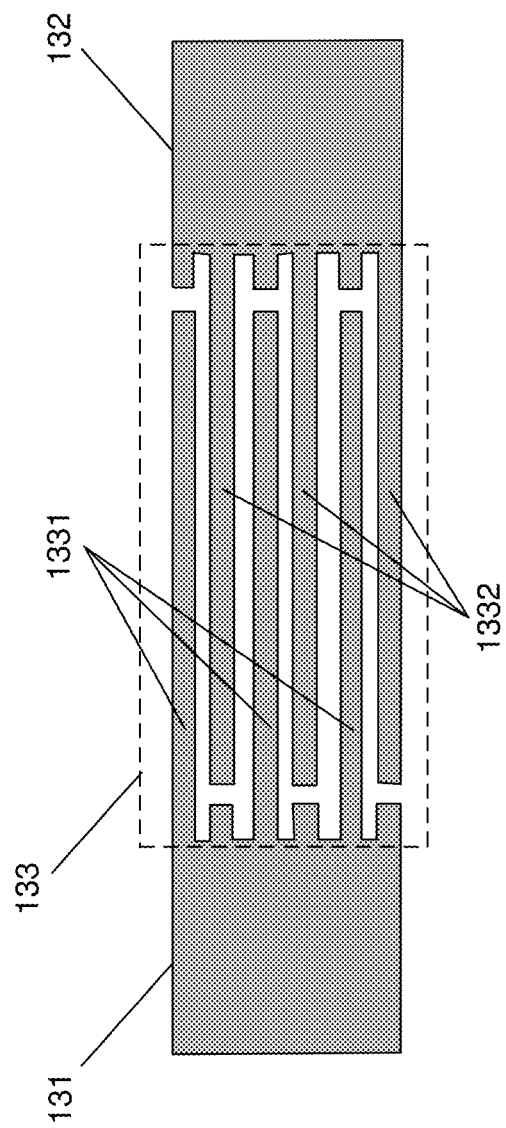
FIG. 1D is a top view of an interdigital transducer (IDT), according to an embodiment of the present disclosure.

FIG. 1D is a top view of IDT 130, according to an embodiment of the present disclosure. As illustrated in FIG. 1D, IDT 130 includes a first input and output end 131, a second input and output end 132, and an interdigital portion 133. Interdigital portion 133 includes a first set of electrode fingers 1331 coupled to first input and output end 131, and a second set of electrode fingers 1332 coupled to second input and output end 132. The second set of electrode fingers 1332 are interleaved with and parallel to the first set of electrode fingers 1331.

Referring back to FIGS. 1A, 1B, and 1C, a first dielectric layer 180 is disposed between piezoelectric layer 140 and bottom substrate 210, and surrounds lower cavity 500a. In other words, first dielectric layer 180 and piezoelectric layer 140 together enclose lower cavity 500a.

Bottom substrate 210 may be formed of Si, $SiO_2$, polysilicon, silicon carbide, sapphire ($Al_2O_3$), or a stacked combination of two or more of those materials. Bottom substrate 210 may be bonded to first dielectric layer 180.

An upper cavity 500b is disposed above piezoelectric layer 140. A top substrate 250 is disposed above and covers upper cavity 500b. A second dielectric layer 240 is disposed between piezoelectric layer 140 and top substrate 250, and surrounds upper cavity 500b. In other words, top substrate 250, second dielectric layer 240, and piezoelectric layer 140 together enclose upper cavity 500b.

Top substrate 250 may be formed of Si, $SiO_2$, polysilicon, silicon carbide, sapphire ($Al_2O_3$), or a stacked combination of two or more of those materials. Top substrate 250 may be bonded to second dielectric layer 240.

One or more release holes 145 are formed in piezoelectric layer 140. The one or more release holes 145 are used for forming lower cavity 500a in an etching and releasing process. In addition, as shown in FIG. 1B, a back electrode contact hole 148 is formed in piezoelectric layer 140, exposing a portion of a top surface of back electrode 150.

A pad metal layer 310 is disposed above IDT 130. A first section 311 of pad metal layer 310 is disposed above first input and output end 131 of IDT 130, a second section 312 of pad metal layer 310 is disposed above second input and output end 132 of IDT 130. A third section 313 of pad metal layer 310 (also referred to as "back electrode pad metal layer 313") is formed above back electrode contact hole 148 and electrically connected to the exposed portion of the top surface of back electrode 150 via back electrode contact hole 148.

A first through silicon via (TSV) 441 and a second TSV 442 are formed in top substrate 250 and second dielectric layer 240. First TSV 441 exposes first section 311 of pad metal layer 310, and second TSV 442 exposes second section 312 of pad metal layer 310.

A redistribution metal layer 260 is disposed on top substrate 250. A first section 261 of redistribution metal layer 260 is electrically connected to first section 311 of pad metal layer 310 via first TSV 441, and a second section 262 of redistribution metal layer 260 is electrically connected to second section 312 of pad metal layer 310 via second TSV 442.

A passivation layer 290 is disposed on top substrate 250 and filled in first TSV 441 and second TSV 442. Passivation layer 290 is formed with a first window 291 exposing first section 261 of redistribution metal layer 260, and a second window 292 exposing second section 262 of redistribution metal layer 260.

An under bump metal (UBM) layer 300 is disposed on passivation layer 290. A first section 301 of UBM layer 300 is disposed above and electrically connected to first section 261 of redistribution metal layer 260 via first window 291, and a second section 302 of UBM layer 300 is disposed above and electrically connected to second section 262 of redistribution metal layer 260 via second window 292.

A first solder bump 281 and a second solder bump 282 are disposed above top substrate 250. First solder bump 281 is disposed above first section 301 of UBM layer 300, and is electrically connected to first section 261 of redistribution metal layer 260 via first section 301 of UBM layer 300. Second solder bump 282 is disposed above second section 302 of UBM layer 300, and is electrically connected to second section 262 of redistribution metal layer 260 via second section 302 of UBM layer 300.

Figure 1E:
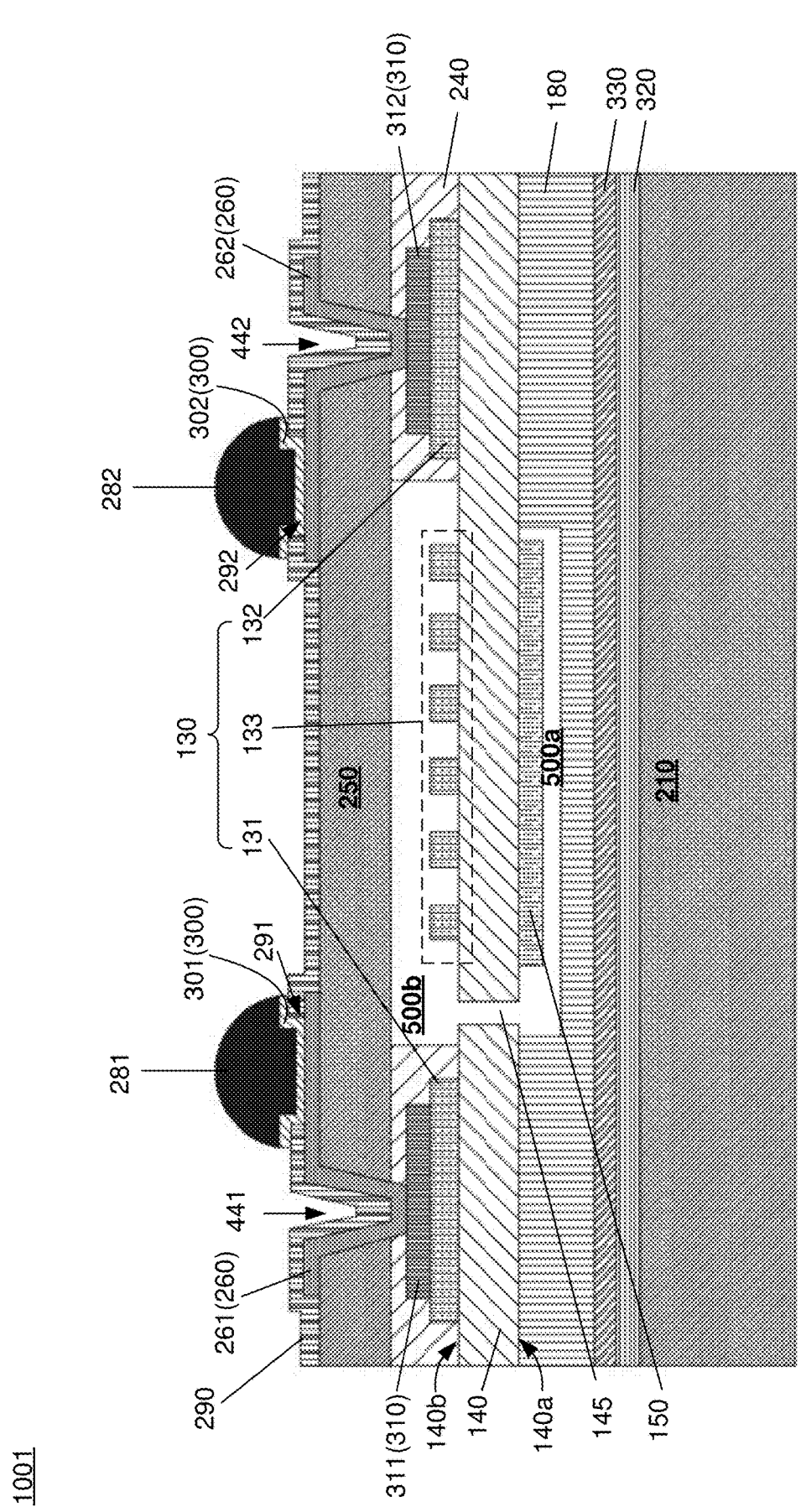
FIG. 1E is a cross-sectional view of a SAW filter, according to an embodiment of the present disclosure.

FIG. 1E is a cross-sectional view of a SAW filter 1001, according to an embodiment of the present disclosure. SAW filter 1001 differs from SAW filter 1000 in that SAW filter 1001 includes a non-conductive layer 320 and a buffer layer 330 disposed between first dielectric layer 180 and bottom substrate 210. Specifically, non-conductive layer 320 is disposed above bottom substrate 210, and buffer layer 330 disposed above non-conductive layer 320. Non-conductive layer 320 and buffer layer 330 function to make the bonding of bottom substrate 210 easier and to ensure the quality of the bonding, or to improve the performance of SAW filter 1001 by improving a quality factor Q of a SAW resonator. Non-conductive layer 320 may be formed of polysilicon, amorphous silicon, silicon nitride, aluminum nitride, gallium nitride, or a stacked combination of two or more of those materials. Non-conductive layer 320 functions to improve the quality factor Q of the SAW resonator. Buffer layer 330 may be formed of silicon nitride, silicon oxide, or a stacked combination of those materials. Buffer layer 330 functions to create a suitable bonding surface for bottom substrate 210, or to balance a warpage of bottom substrate 210, so that bottom substrate 210 is bonded to first dielectric layer 180 more smoothly.

In some alternative embodiments, a SAW filter may include only one of non-conductive layer 320 and buffer layer 330. For example, a SAW filter may include non-conductive layer 320 disposed between first dielectric layer 180 and bottom substrate 210. Alternatively, a SAW filter may include buffer layer 330 disposed between first dielectric layer 180 and bottom substrate 210.

Except for non-conductive layer 320 and buffer layer 330, the structure and components of SAW filter 1001 are the same as those of SAW filter 1000, and therefore detailed descriptions of the other components of SAW filter 1001 are not repeated.

Figure 2:
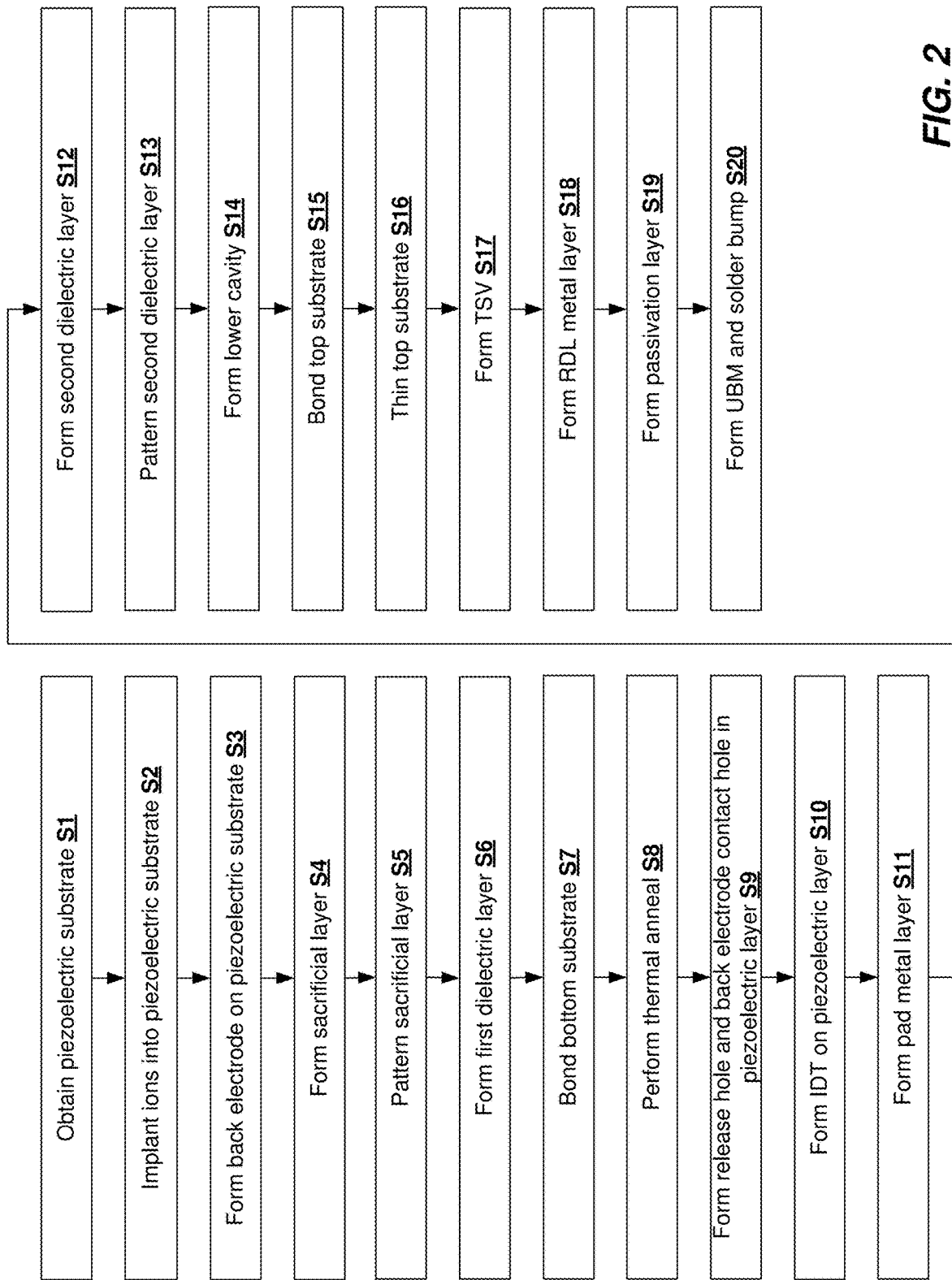
FIG. 2 is a flow chart of a process of fabricating the SAW filter of FIG. 1A, according to an embodiment of the present disclosure.

FIG. 2 is a flow chart of a process of fabricating SAW filter 1000, according to an embodiment of the present disclosure. FIGS. 3A-3T are cross-sectional views of structures formed in the process of FIG. 2, according to an embodiment of the present disclosure.

As illustrated in FIG. 3A, in step S1, a piezoelectric substrate 100 is obtained. The piezoelectric substrate may be a lithium niobate or lithium tantalate single crystal substrate.

Figure 3B:
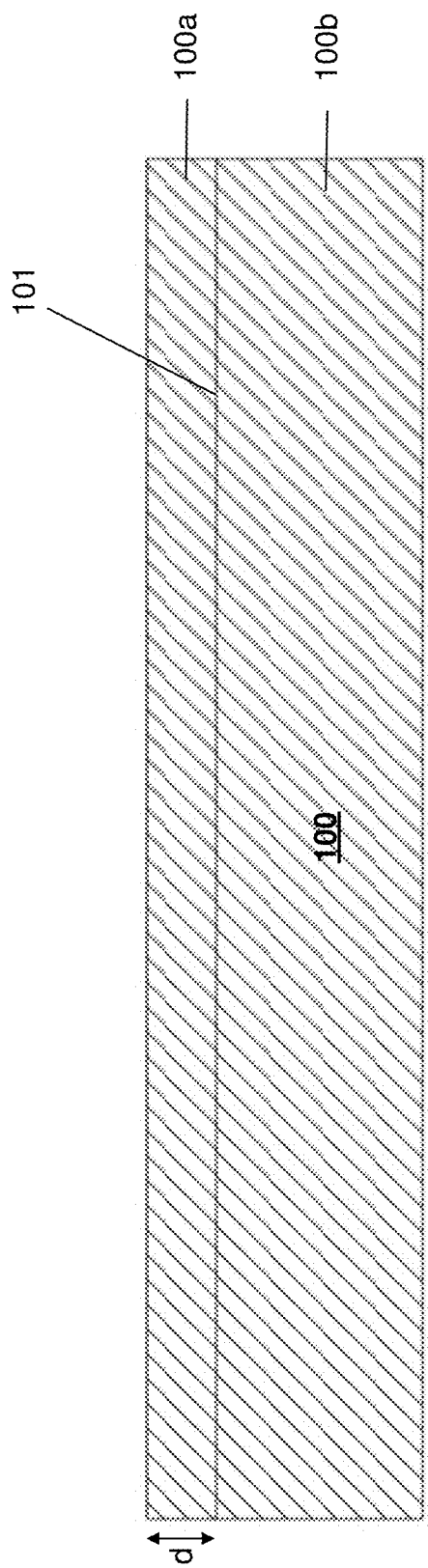
FIGS. 3A-3T are cross-sectional views of structures formed in the process of FIG. 2, according to an embodiment of the present disclosure.

As illustrated in FIG. 3B, in step S2, ions are implanted into piezoelectric substrate 100 at a predetermined implantation depth d, thereby forming an ion layer 101 at depth d of piezoelectric substrate 100. The ions may be helium or hydrogen ions. Implantation depth d may be determined based on a desired thickness of piezoelectric layer 140. For example, implantation depth d may range from approximately 0.3 μm to approximately 10 μm. A first portion 100a of piezoelectric substrate 100 is disposed above ion layer 101, and a second portion 100b of piezoelectric substrate 100 is disposed below ion layer 101.

Figure 3C:
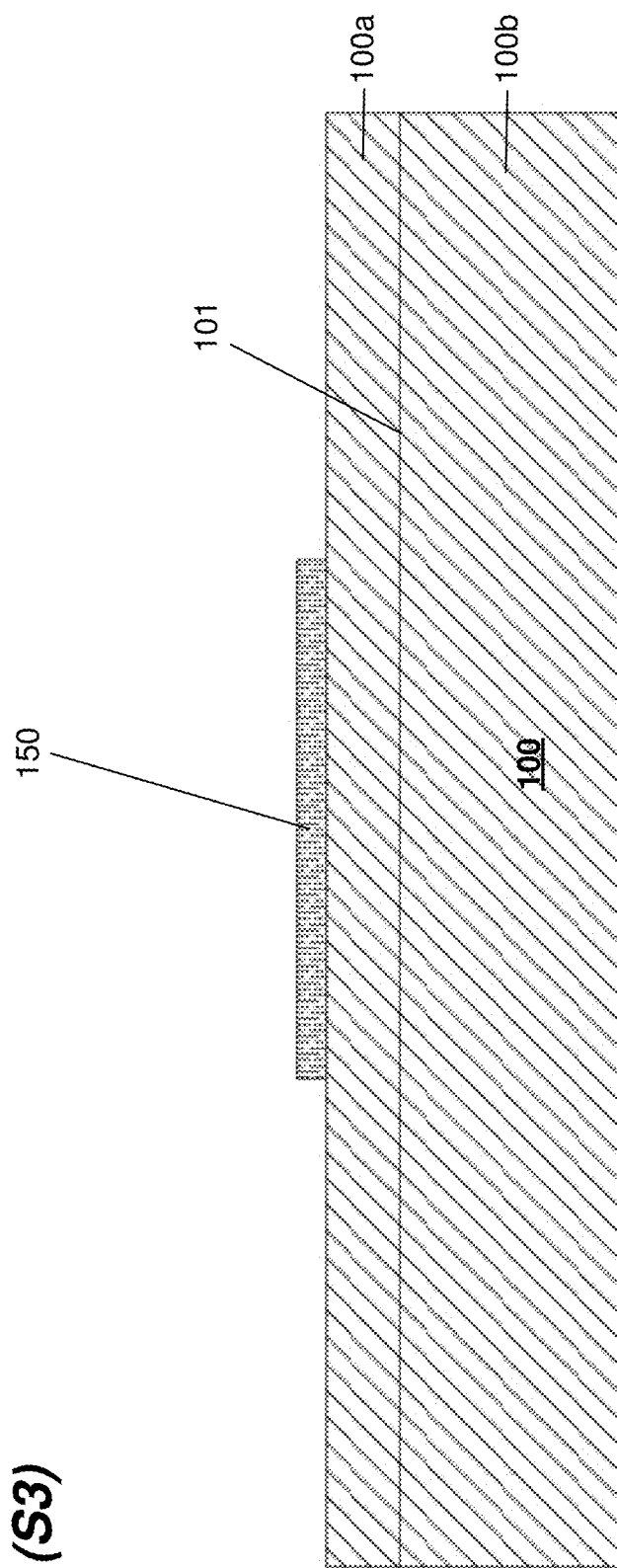

As illustrated in FIG. 3C, in step S3, back electrode 150 is formed on first portion 100a of piezoelectric substrate 100. Back electrode 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc.

Figure 3D:
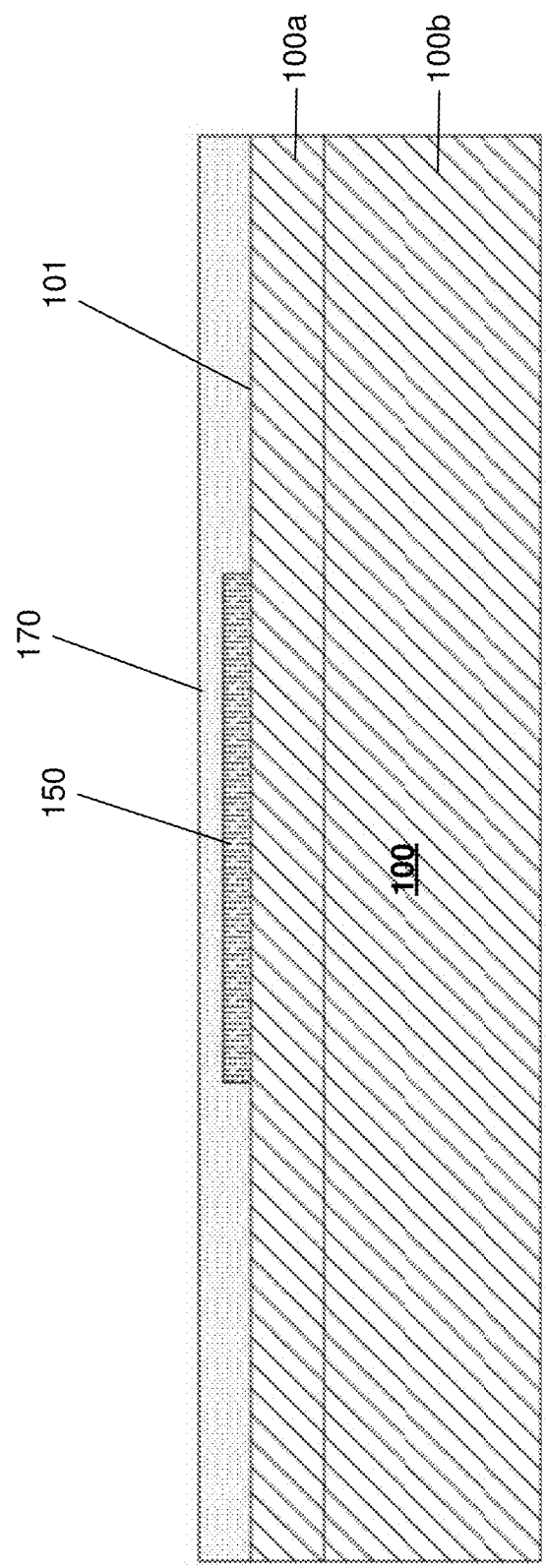

As illustrated in FIG. 3D, in step S4, sacrificial layer 170 is deposited on first portion 100a of piezoelectric substrate 100, covering back electrode 150. Sacrificial layer 170 may include Si, such as amorphous Si or polysilicon.

Figure 3E:
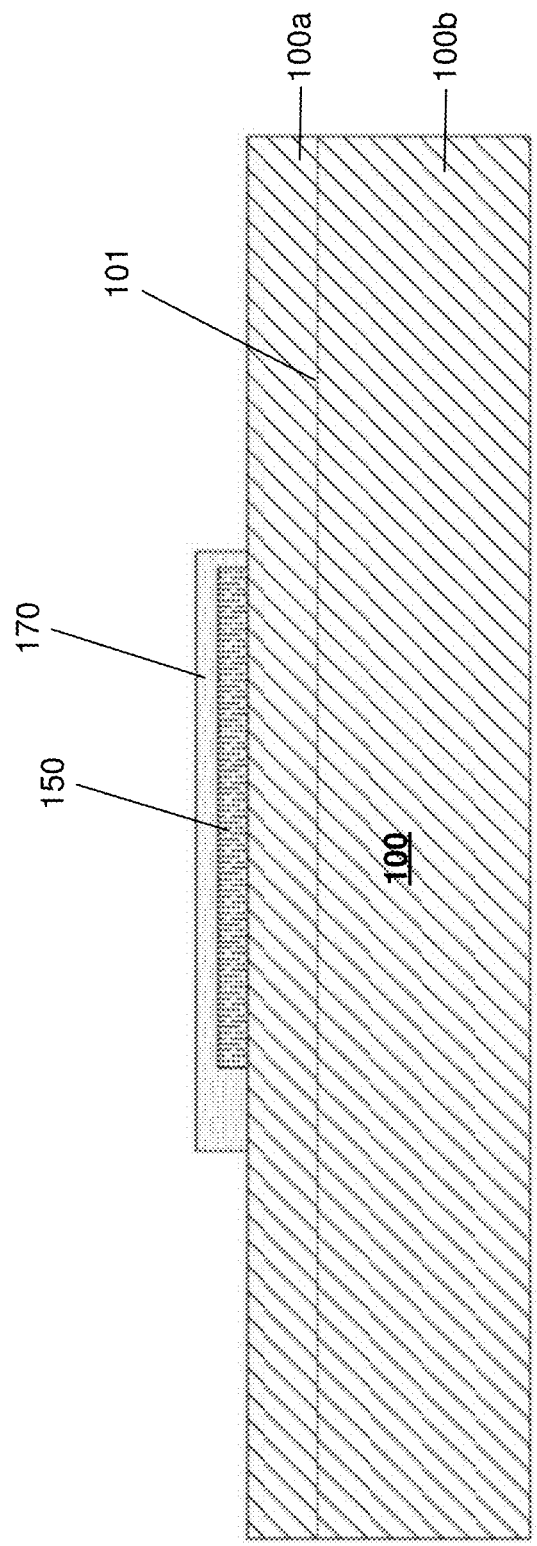

As illustrated in FIG. 3E, in step S5, sacrificial layer 170 is patterned by etching. The patterned sacrificial layer 170 covers back electrode 150. Sacrificial layer 170 will be removed during a subsequent etching and releasing process, thereby forming lower cavity 500a.

Figure 3F:
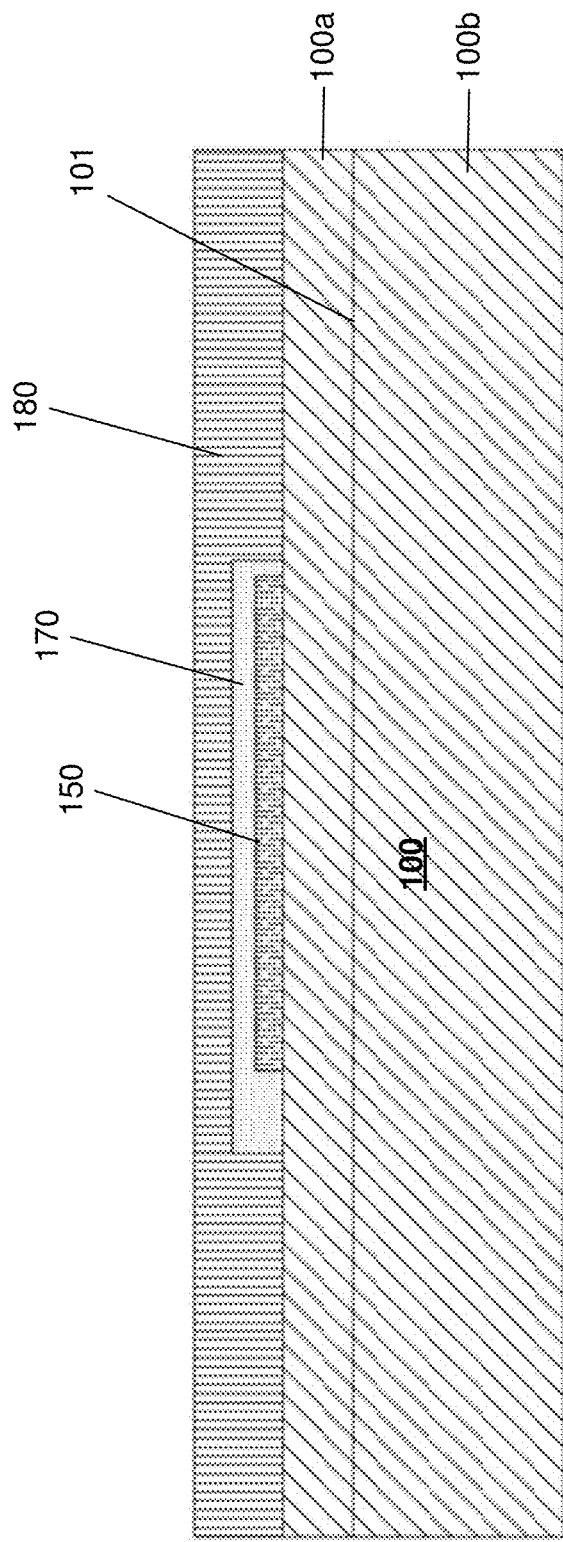

As illustrated in FIG. 3F, in step S6, first dielectric layer 180 is deposited on first portion 100a of piezoelectric substrate 100, covering sacrificial layer 170. Then, surface planarization and polishing are performed on first dielectric layer 180, by using a chemical mechanical polishing (CMP) process. The planarized first dielectric layer 180 still covers sacrificial layer 170.

Figure 3G:
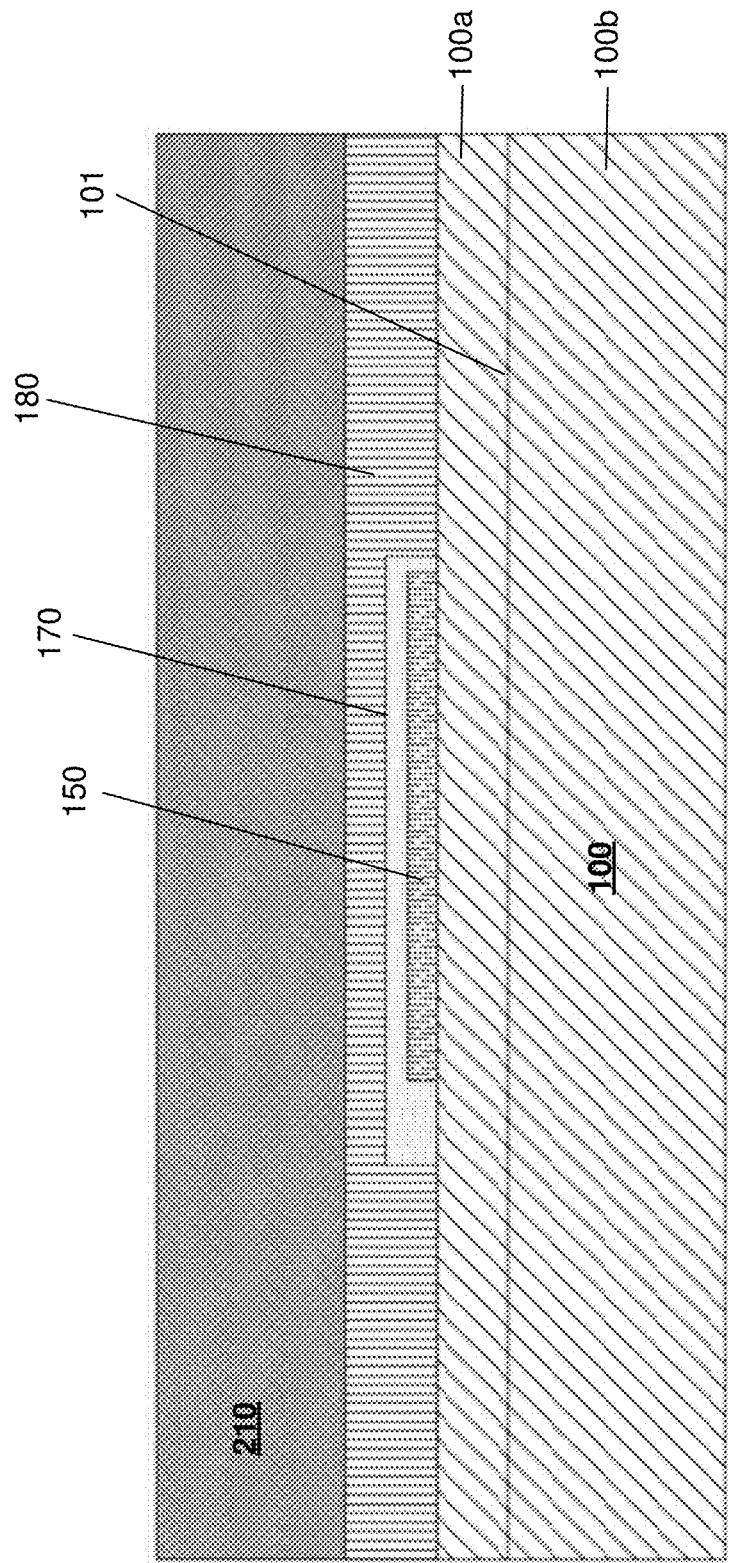

As illustrated in FIG. 3G, in step S7, bottom substrate 210 is bonded to first dielectric layer 180. Bottom substrate 210 may include Si, $SiO_2$, polysilicon, silicon carbide, sapphire ($Al_2O_3$), or a stacked combination of two or more of those materials.

Figure 3H:
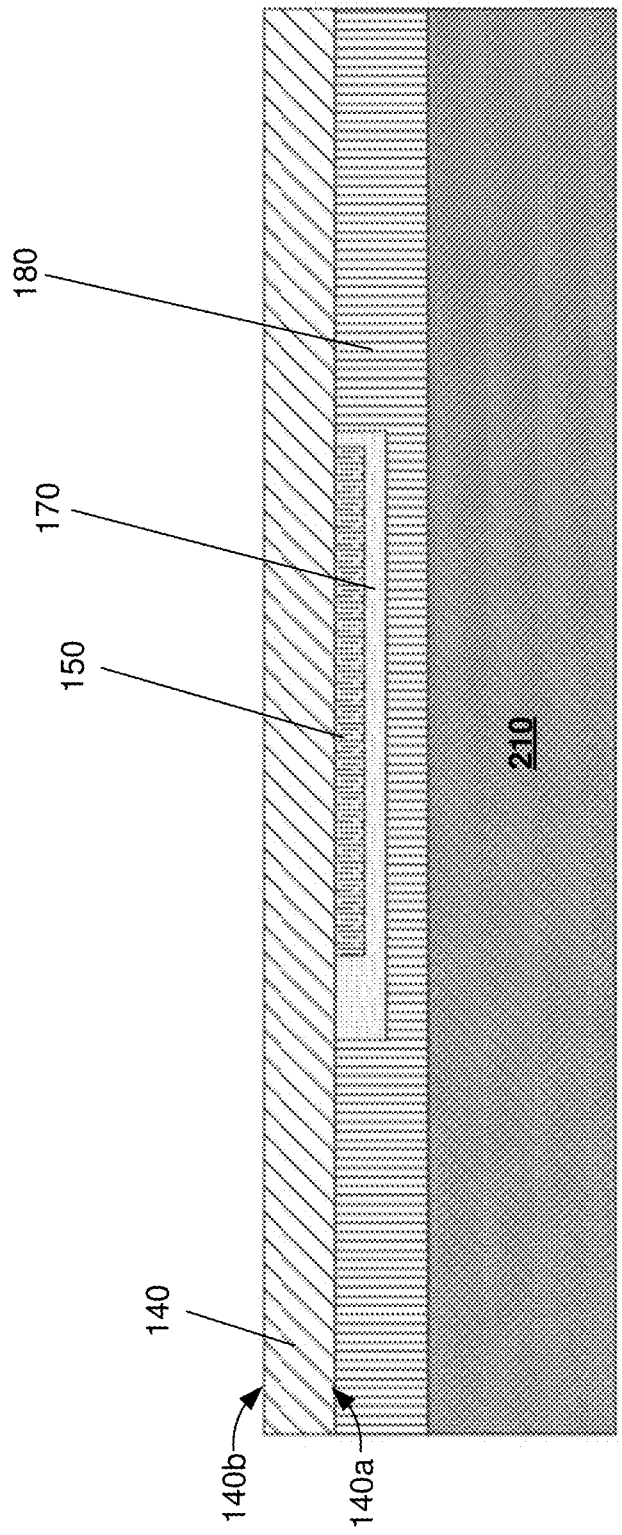

As illustrated in FIG. 3H, in step S8, the structure shown in FIG. 3G is flipped over and a thermal anneal is performed on the structure. The annealing temperature may range from approximately 400° C. to approximately 650° C. As a result of thermal anneal, ion layer 101 in piezoelectric substrate 100 is broken. Second portion 100b of piezoelectric substrate 100 below ion layer 101 is removed, while first portion 100a of piezoelectric substrate 100 above ion layer 101 remains. First portion 100a of piezoelectric substrate 100 constitutes piezoelectric layer 140 in SAW filter 1000. Piezoelectric layer 140 has bottom surface 140a where back electrode 150 is formed, and top surface 140b exposed. A CMP polishing may be performed on the exposed top surface 140b of piezoelectric layer 140 to obtain a smooth surface, and to achieve the desired thickness of piezoelectric layer 140 in SAW filter 1000. In some embodiments, an ion beam etching (IBE) or ion beam milling process may be performed on piezoelectric layer 140 to achieve a more uniform thickness.

Figure 3I:
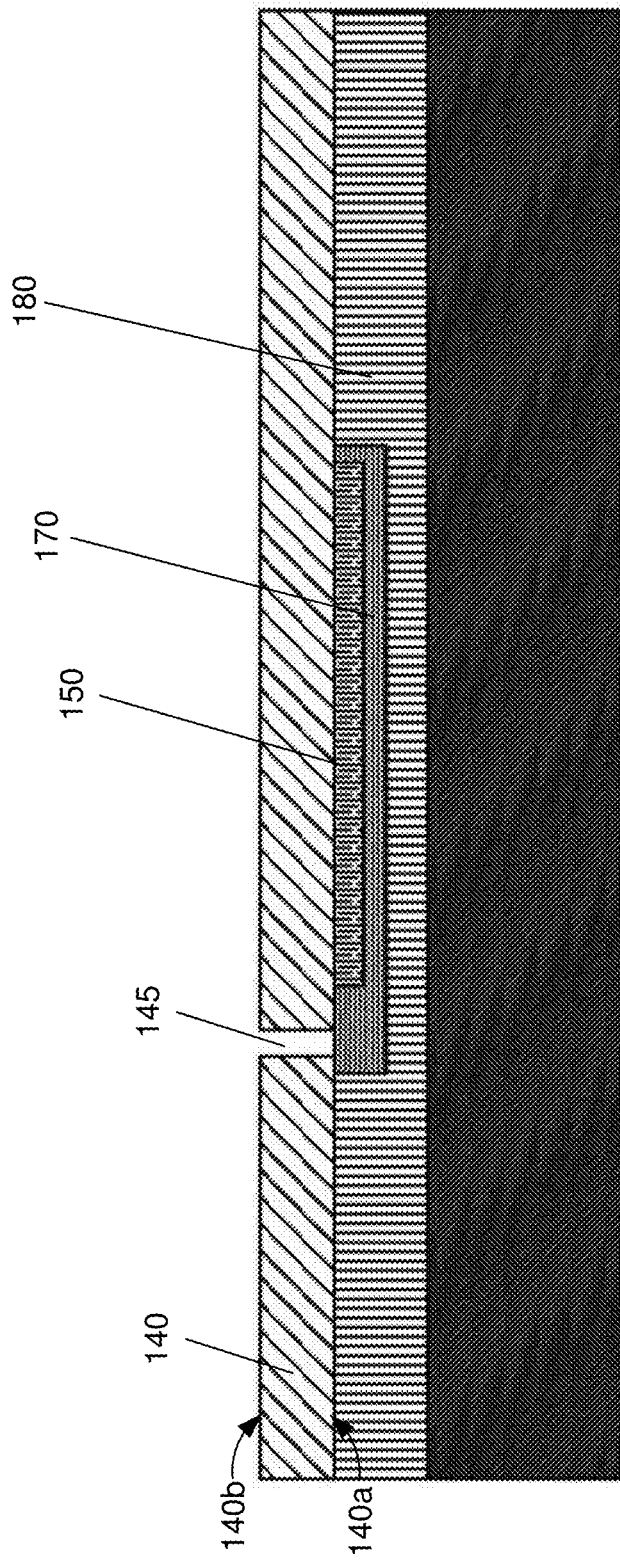

As illustrated in FIG. 3I, in step S9, piezoelectric layer 140 is etched to form one or more release holes 145 through piezoelectric layer 140. Each release hole 145 exposes a portion of sacrificial layer 170. In addition, although not shown in FIG. 3I, in step S9, back electrode contact hole 148 (illustrated in FIG. 1B) is formed in piezoelectric layer 140. Back electrode contact hole 148 exposes a portion of a top surface of back electrode 150.

Figure 3J:
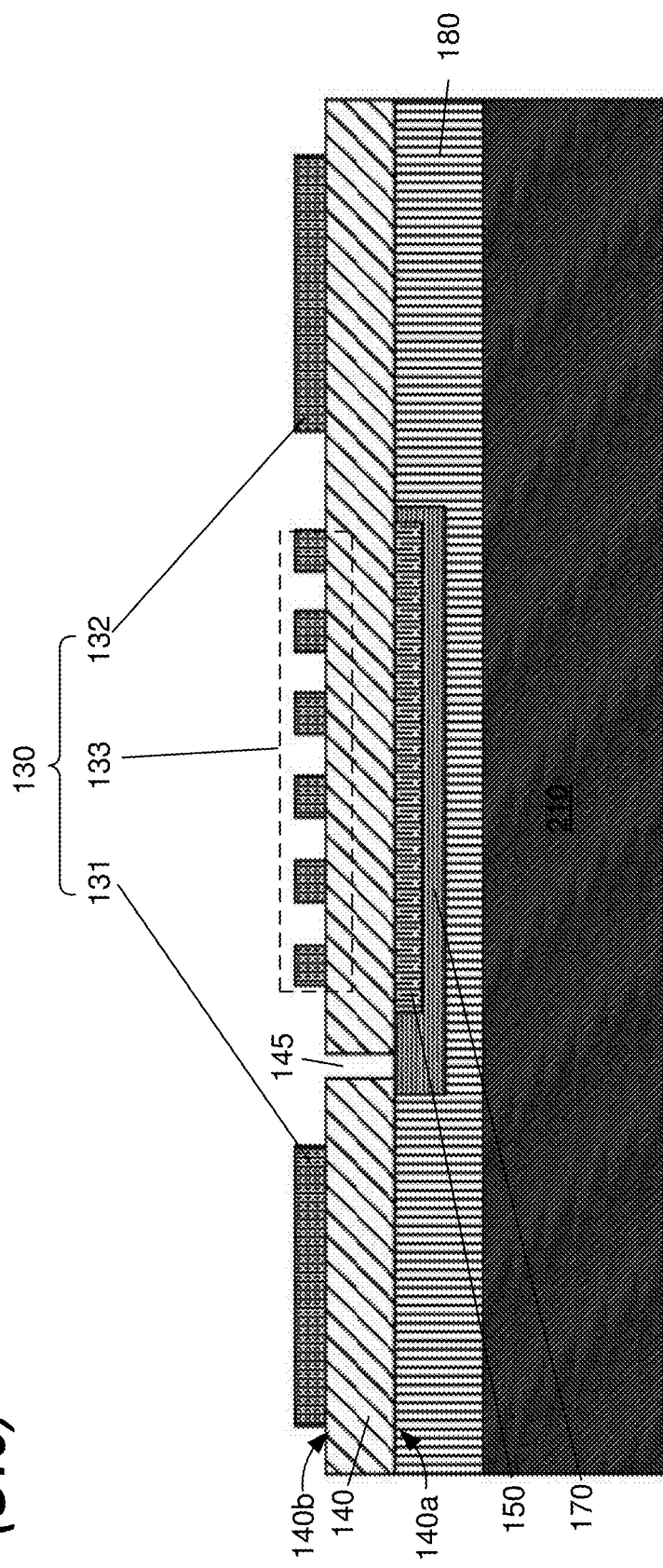

As illustrated in FIG. 3J, in step S10, IDT 130 is formed on top surface 140b of piezoelectric layer 140. IDT 130 includes first input and output end 131, second input and output end 132, and interdigital portion 133 disposed between first and second input and output ends 131 and 132. Interdigital portion 133 is vertically aligned with back electrode 150.

Figure 3K:
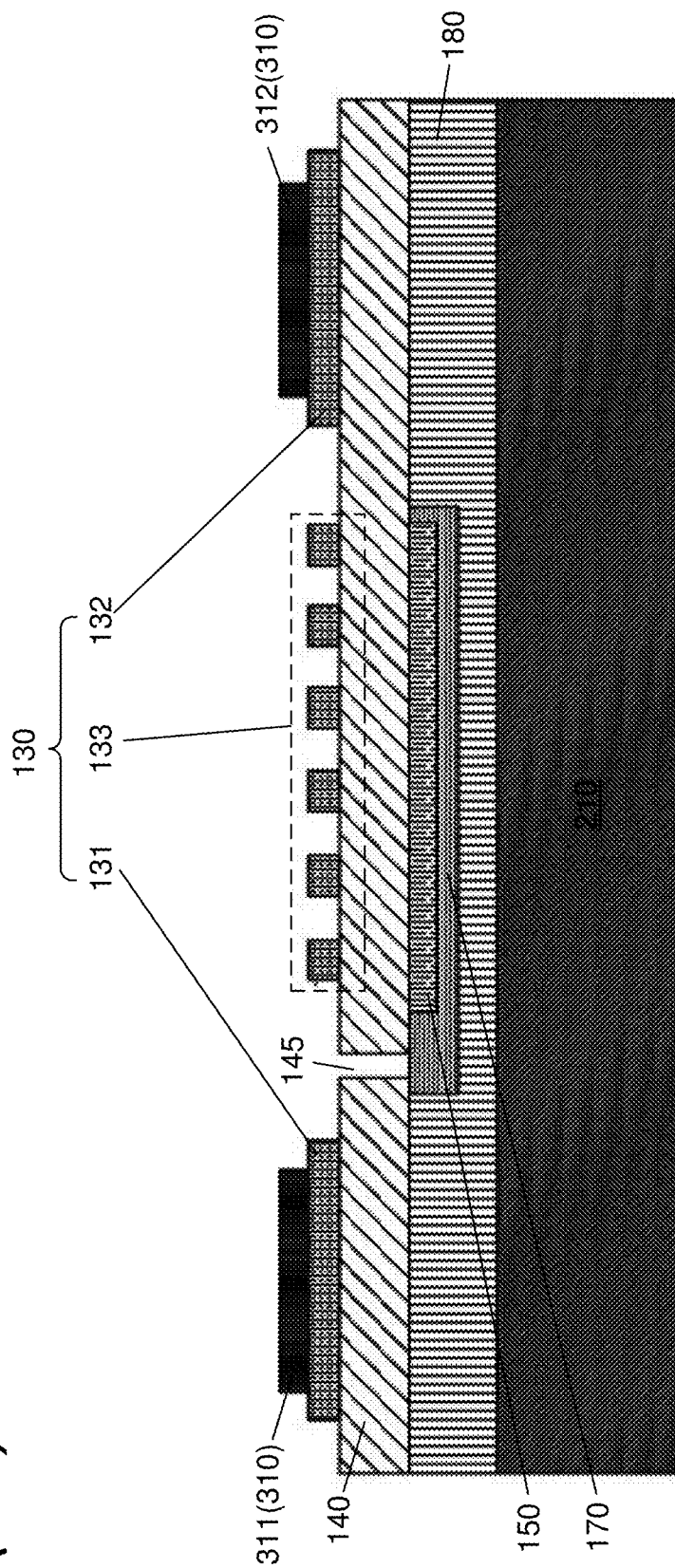

As illustrated in FIG. 3K, in step S11, a pad metal layer 310 is formed on IDT 130. Then, pad metal layer 310 is patterned to form first section 311 disposed above and electrically connected to first input and output end 131 of IDT 130, second section 312 disposed above and electrically connected to second input and output end 132 of IDT 130, and third section 313 (not illustrated in FIG. 3K, but illustrated in FIG. 1B) disposed above back electrode contact hole 148 and electrically connected to back electrode 150 via back electrode contact hole 148.

Figure 3L:
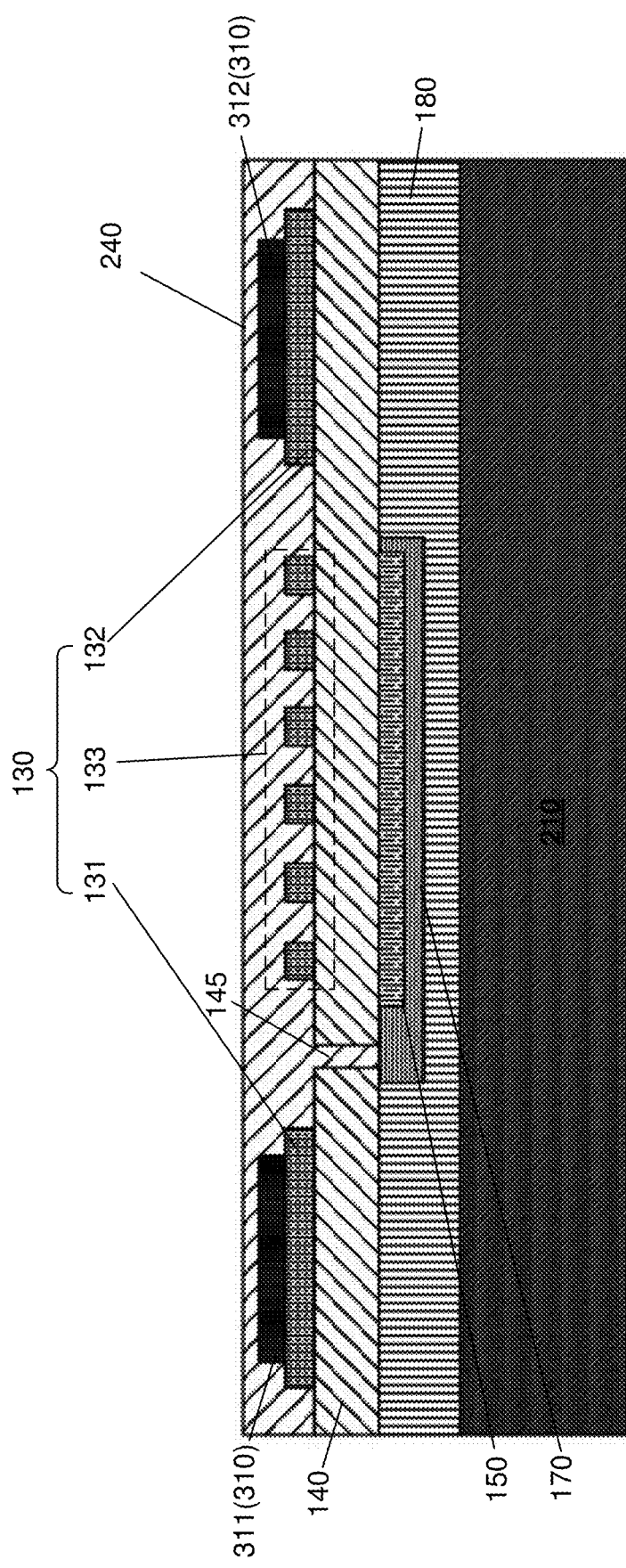

As illustrated in FIG. 3L, in step S12, second dielectric layer 240 is deposited on piezoelectric layer 140, covering the entire IDT 130, and filling into the one or more release holes 145. Second dielectric layer 240 may be formed of silicon oxide, silicon nitride, or a stacked combination of those materials. Second dielectric layer 240 may be deposited by using a chemical vapor deposition (CVD) process or a physical vapor deposition (PVD) process. A CMP planarization process may be performed on second dielectric layer 240, such that a top surface of second dielectric layer 240 is parallel to top surface 140b of piezoelectric layer 140.

Figure 3M:
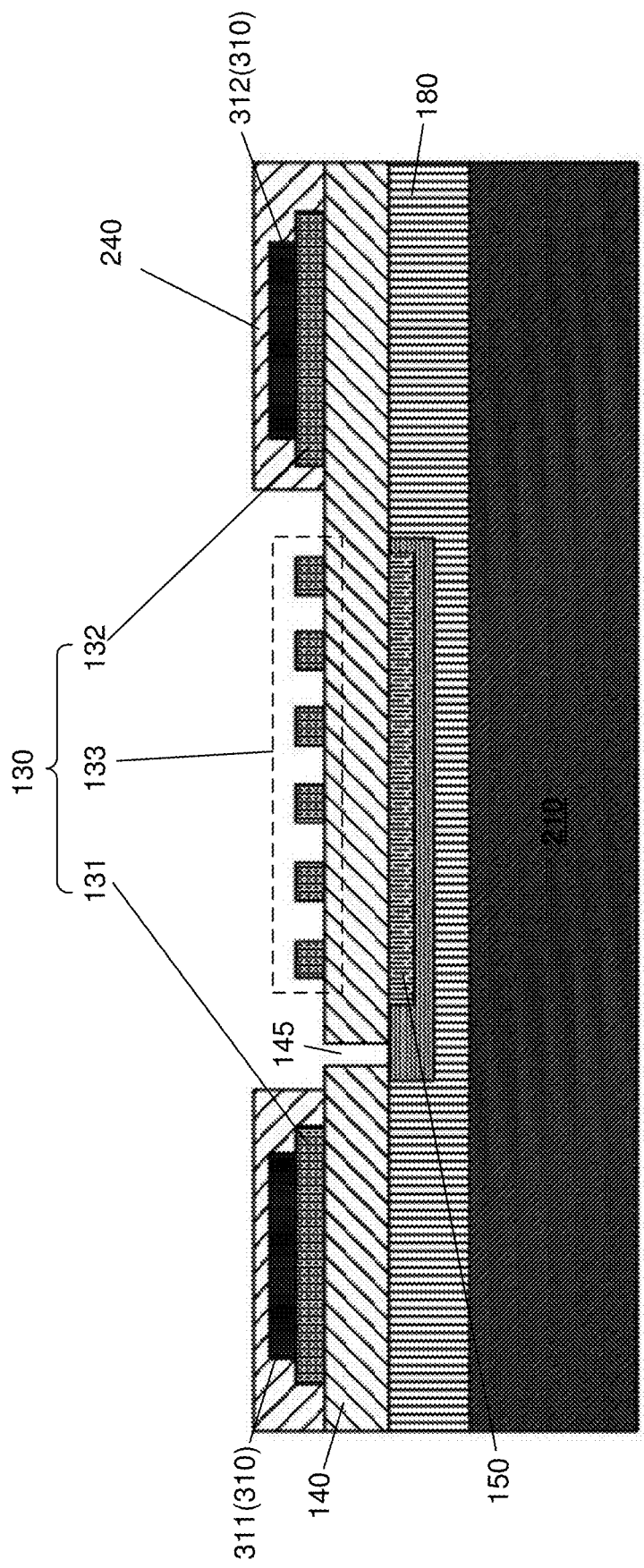

As illustrated in FIG. 3M, in step S13, second dielectric layer 240 is patterned by etching. As a result of the patterning, a portion of second dielectric layer 240 is removed to expose interdigital portion 133 of IDT 130 and a portion of piezoelectric layer 140. An area of the removed portion of second dielectric layer 240 is greater than an area of interdigital portion 133 of IDT 130. First and second input and output ends 131 and 132 of IDT 130, and first and second sections 311 and 312 of pad metal layer 310 are covered by second dielectric layer 240. In addition, in step S13, the portion of second dielectric layer 240 filling into the one or more release holes 145 are removed, exposing portions of sacrificial layer 170.

Figure 3N:
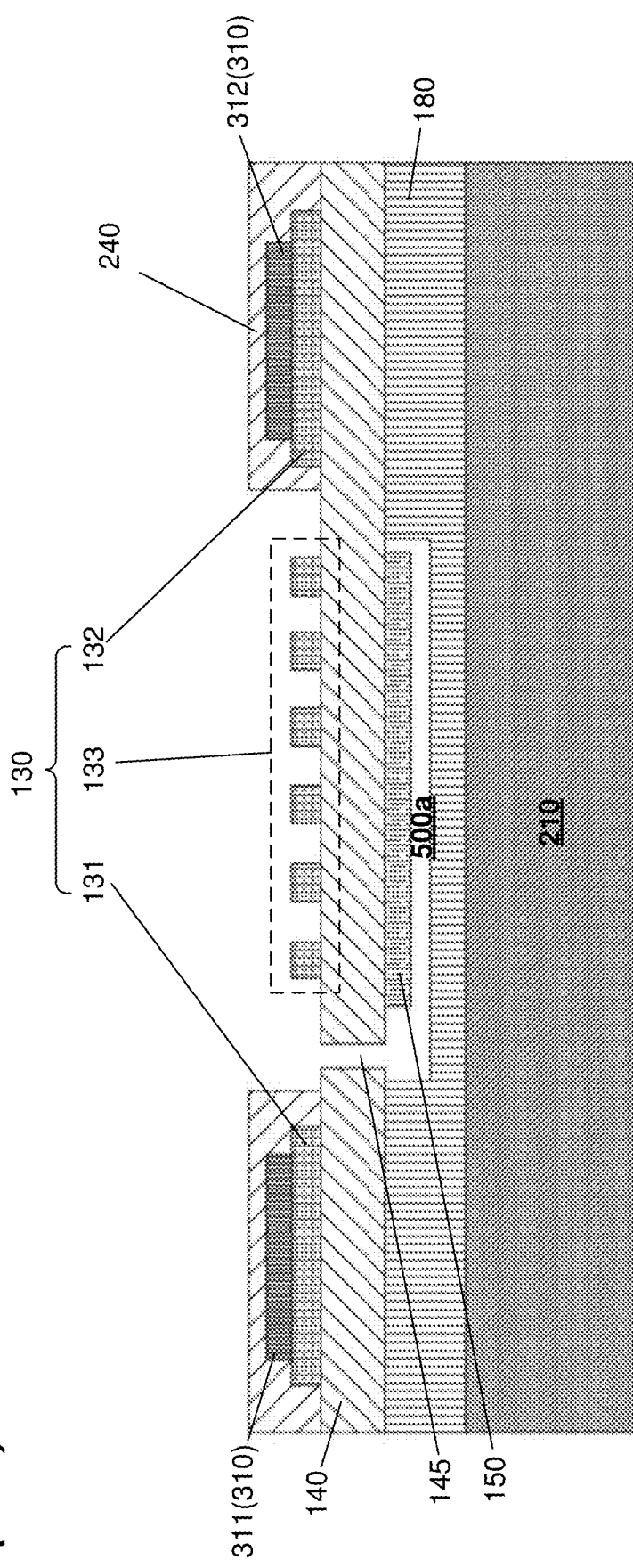

As illustrated in FIG. 3N, in step S14, sacrificial layer 170 is etched and released to form lower cavity 500a below back electrode 150. Sacrificial layer 170 may be etched by a dry etch process using $XeF_2$ plasma. The etchant and etching products of the etching process may be released through the one or more release holes 145.

Figure 3O:
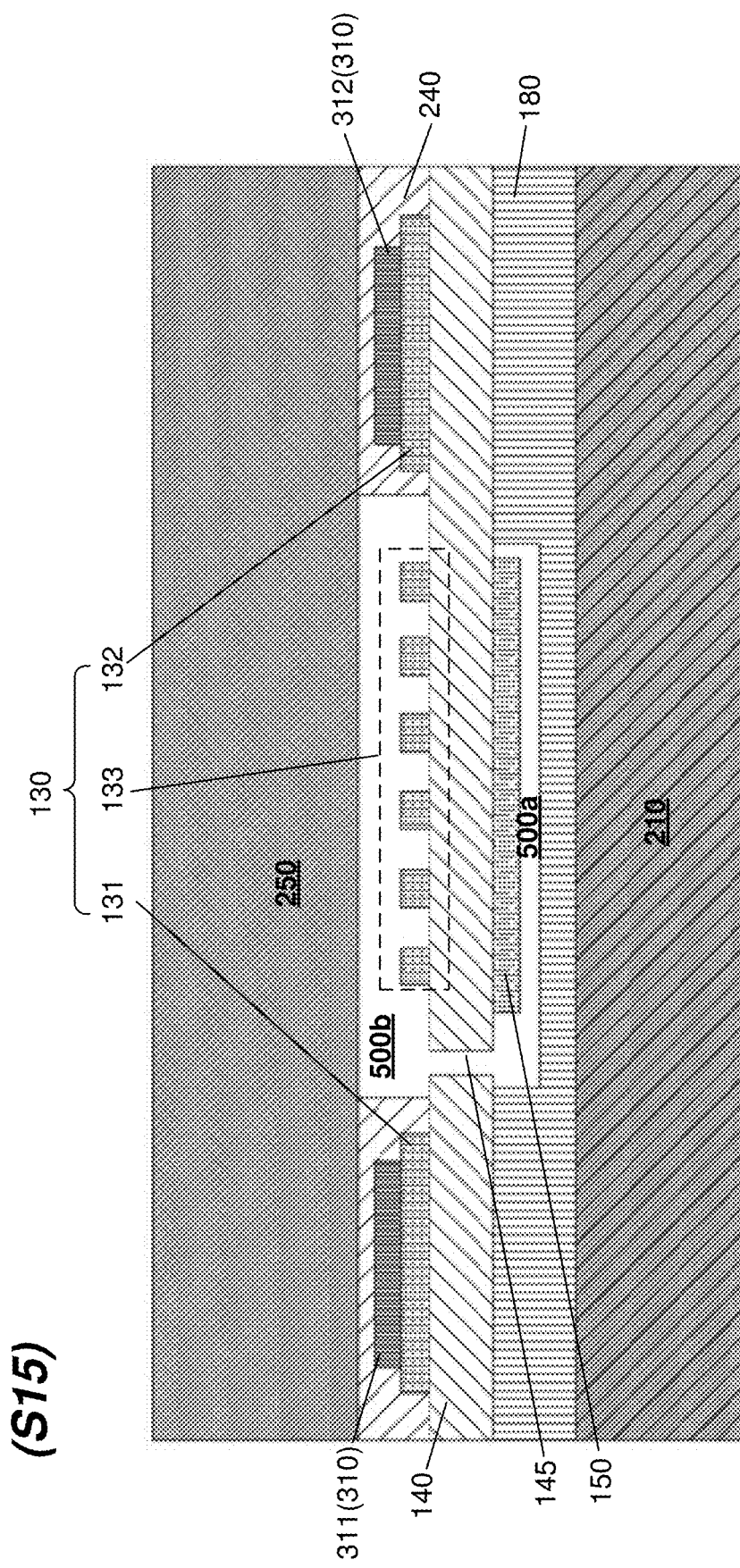

As illustrated in FIG. 3O, in step S15, top substrate 250 is bonded to second dielectric layer 240. Top substrate 250, second dielectric layer 240, and piezoelectric layer 140 together enclose upper cavity 500b. Top substrate 250 may include Si, $SiO_2$, polysilicon, silicon carbide, sapphire ($Al_2O_3$), or a stacked combination of two or more of those materials.

Figure 3P:
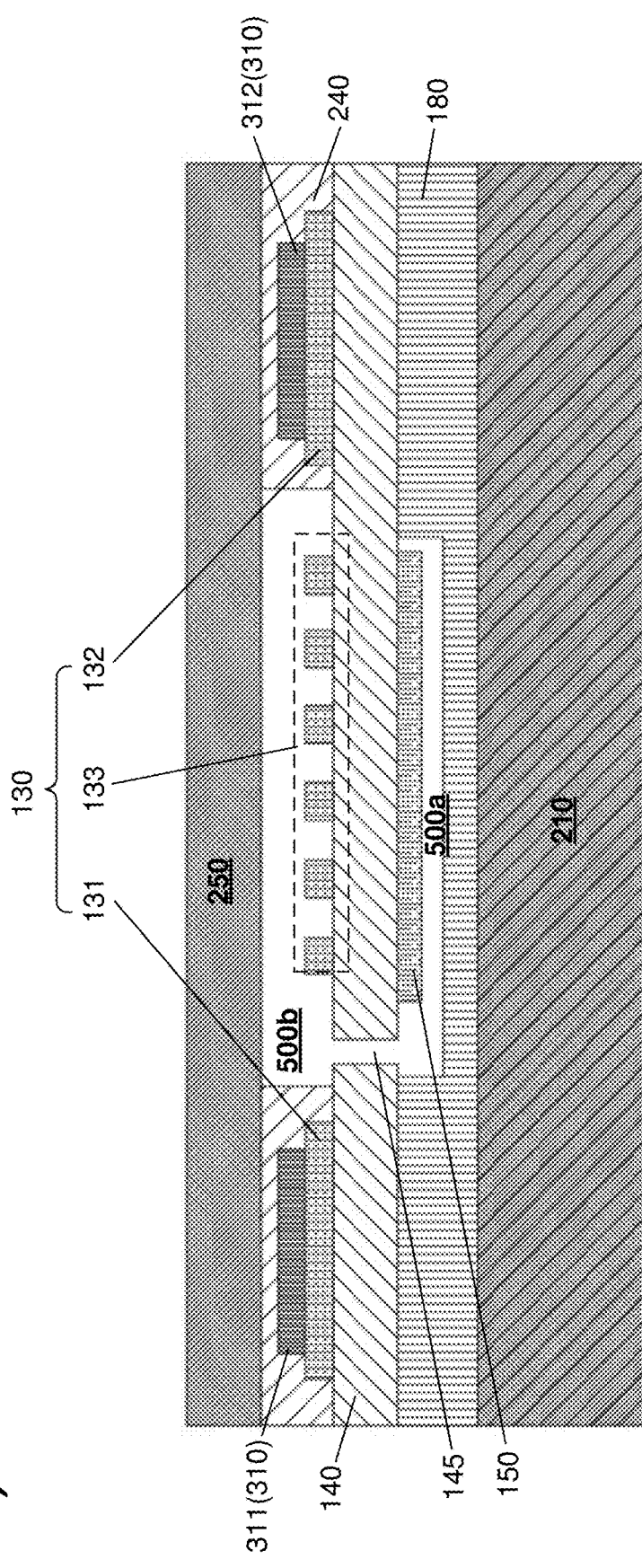

As illustrated in FIG. 3P, in step S16, top substrate 250 is thinned to a predetermined thickness.

Figure 3Q:
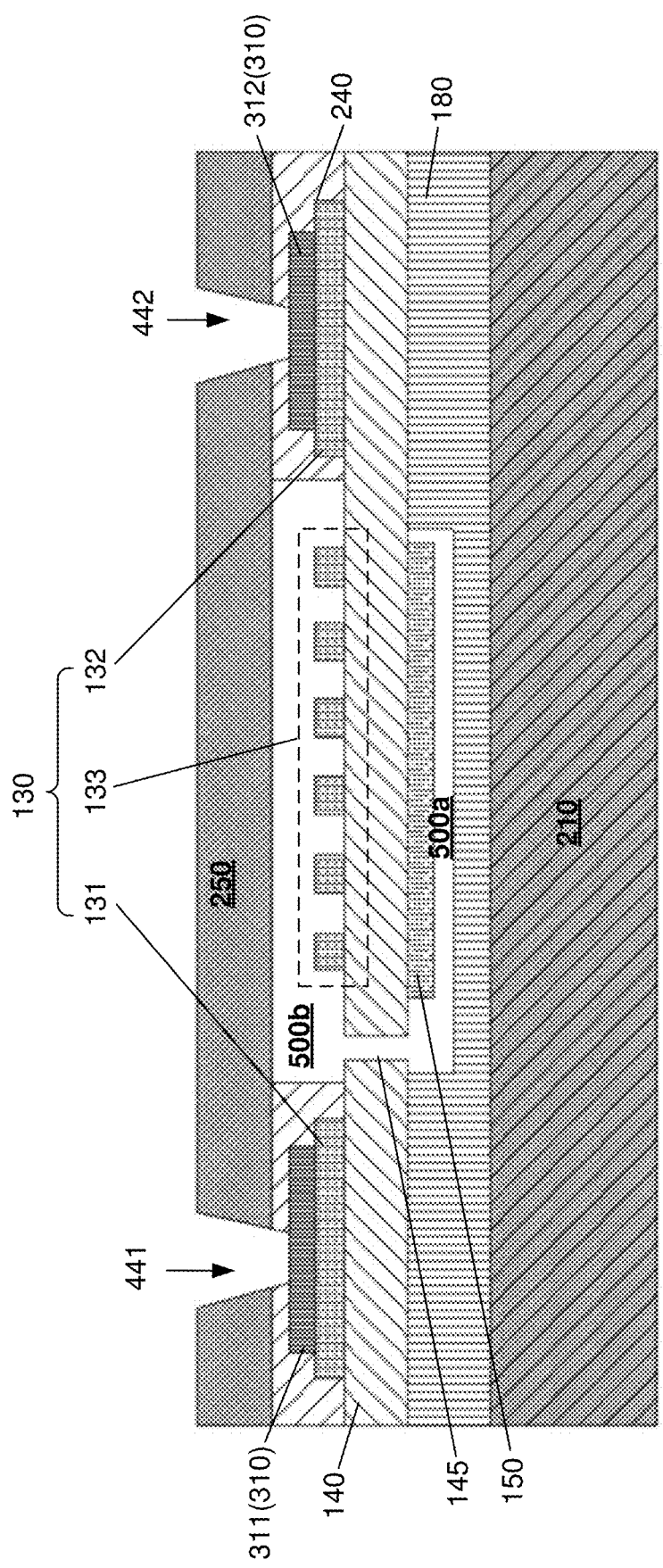

As illustrated in FIG. 3Q, in step S17, first TSV 441 and second TSV 442 are formed in top substrate 250 and second dielectric layer 240. First TSV 441 exposes first section 311 of pad metal layer 310 which is electrically connected to first input and output end 131 of IDT 130, and second TSV 442 exposes second section 312 of pad metal layer 310 which is electrically connected to second input and output end 132 of IDT 130.

Figure 3R:
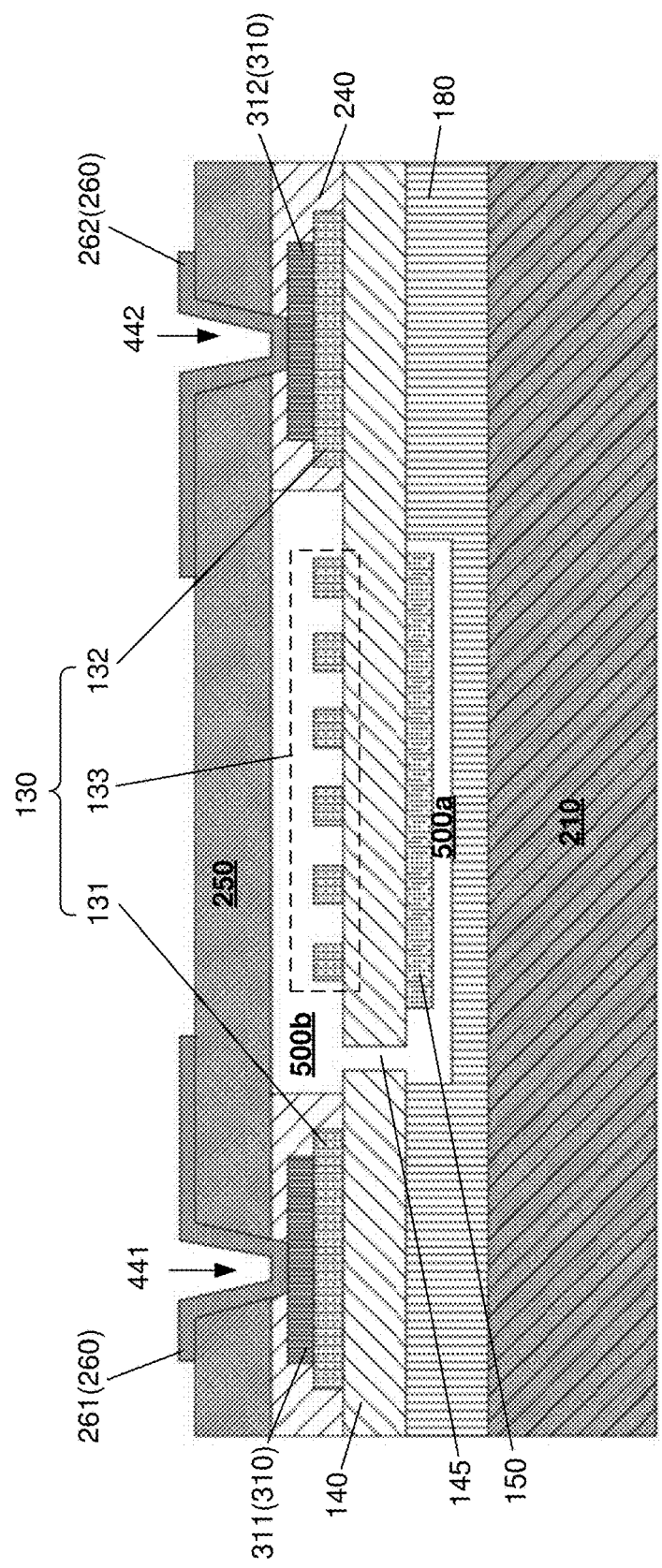

As illustrated in FIG. 3R, in step S18, redistribution metal layer 260 is formed on top substrate 250 and within first and second TSVs 441 and 442. The redistribution metal layer 260 is patterned to form first section 261 contacting first section 311 of pad metal layer 310 via first TSV 441, and second section 262 contacting second section 312 of pad metal layer 310 via second TSV 442. As a result, first section 261 of redistribution metal layer 260 is electrically connected to first input and output end 131 of IDT 130, and second section 262 of redistribution metal layer 260 is electrically connected to second input and output end 132 of IDT 130.

Figure 3S:
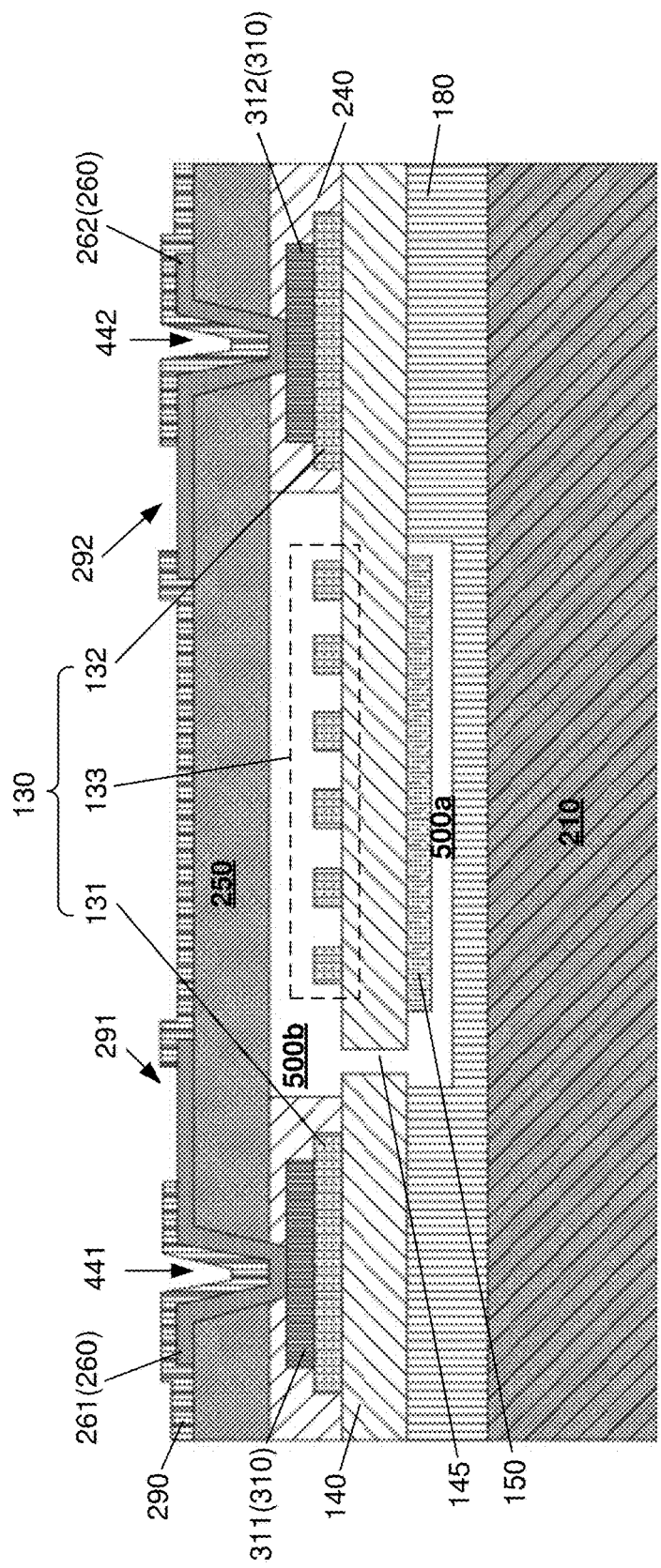

As illustrated in FIG. 3S, in step S19, passivation layer 290 is formed on top substrate 250 and covering redistribution metal layer 260. Then, passivation layer 290 is etched to form a first window 291 exposing a portion of first section 261 of redistribution metal layer 260 and a second window 292 exposing a portion of second section 262 of redistribution metal layer 260. Passivation layer 290 may include an organic material such as, for example, polyimide. First window 291 is not vertically aligned with first TSV 441, and second window 292 is not vertically aligned with second TSV 442.

As illustrated in FIG. 3T, in step S20, UBM layer 300 is formed on passivation layer 290. UBM layer 300 is patterned to form first section 301 contacting the exposed portion of first section 261 of redistribution metal layer 260 via first window 291 of passivation layer 290, and second section 302 contacting the exposed portion of second section 262 of redistribution metal layer 260 via second window 292 of passivation layer 290. Afterwards, first solder bump 281 is formed on and contacts first section 301 of UBM layer 300, and second solder bump 282 is formed on and contacts second section 302 of UBM layer 300. As a result, first solder bump 281 is electrically connected to first input and output end 131 of IDT 130, and second solder bump 282 is electrically connected to second input and output end 132 of IDT 130. Thus, SAW filter 1000 illustrated in FIG. 1A is fabricated.

Figure 4:
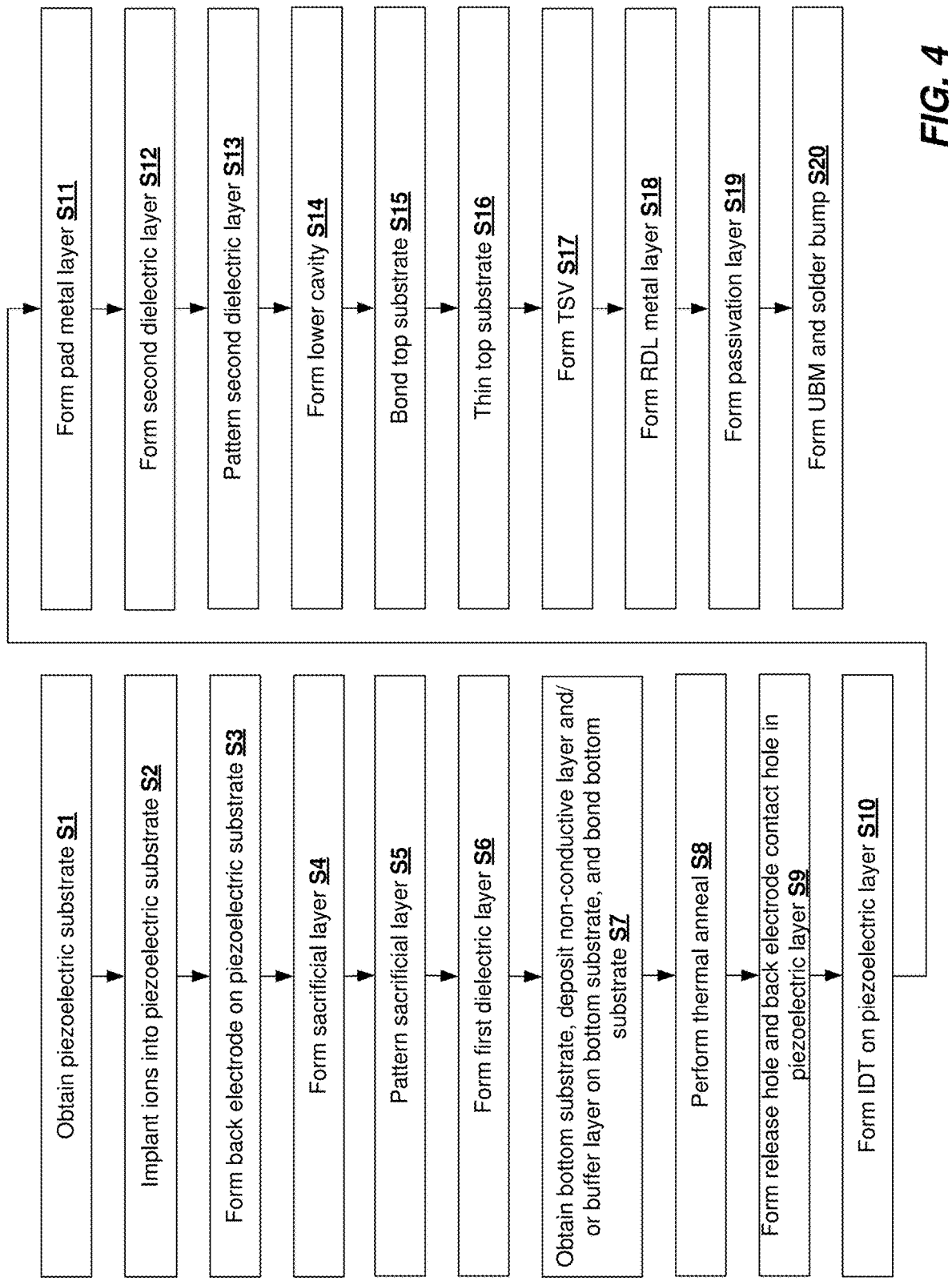
FIG. 4 is a flow chart of a process of fabricating the SAW filter of FIG. 1E, according to an embodiment of the present disclosure.

FIG. 4 is a flow chart of a process of fabricating SAW filter 1001 illustrated FIG. 1E, according to an embodiment of the present disclosure. The process of fabricating SAW filter 1001 as the process of fabricating SAW filter 1000 except that, at step S7, bottom substrate 210 is obtained, at least one of non-conductive layer 320 or buffer layer 330 are deposited on bottom substrate 210, and then bottom substrate 210 deposited with at least one of non-conductive layer 320 or buffer layer 330 is bonded to first dielectric layer 180. When both of non-conductive layer 320 and buffer layer 330 are deposited on bottom substrate 210, non-conductive layer 320 is first deposited on bottom substrate 210, and then buffer layer 330 is deposited on non-conductive layer 320.

Except for step S7, the fabrication process of SAW filter 1001 is the same as that of SAW filter 1000, and therefore detailed descriptions of the other steps of fabricating SAW filter 1001 are not repeated.

Figure 5A:
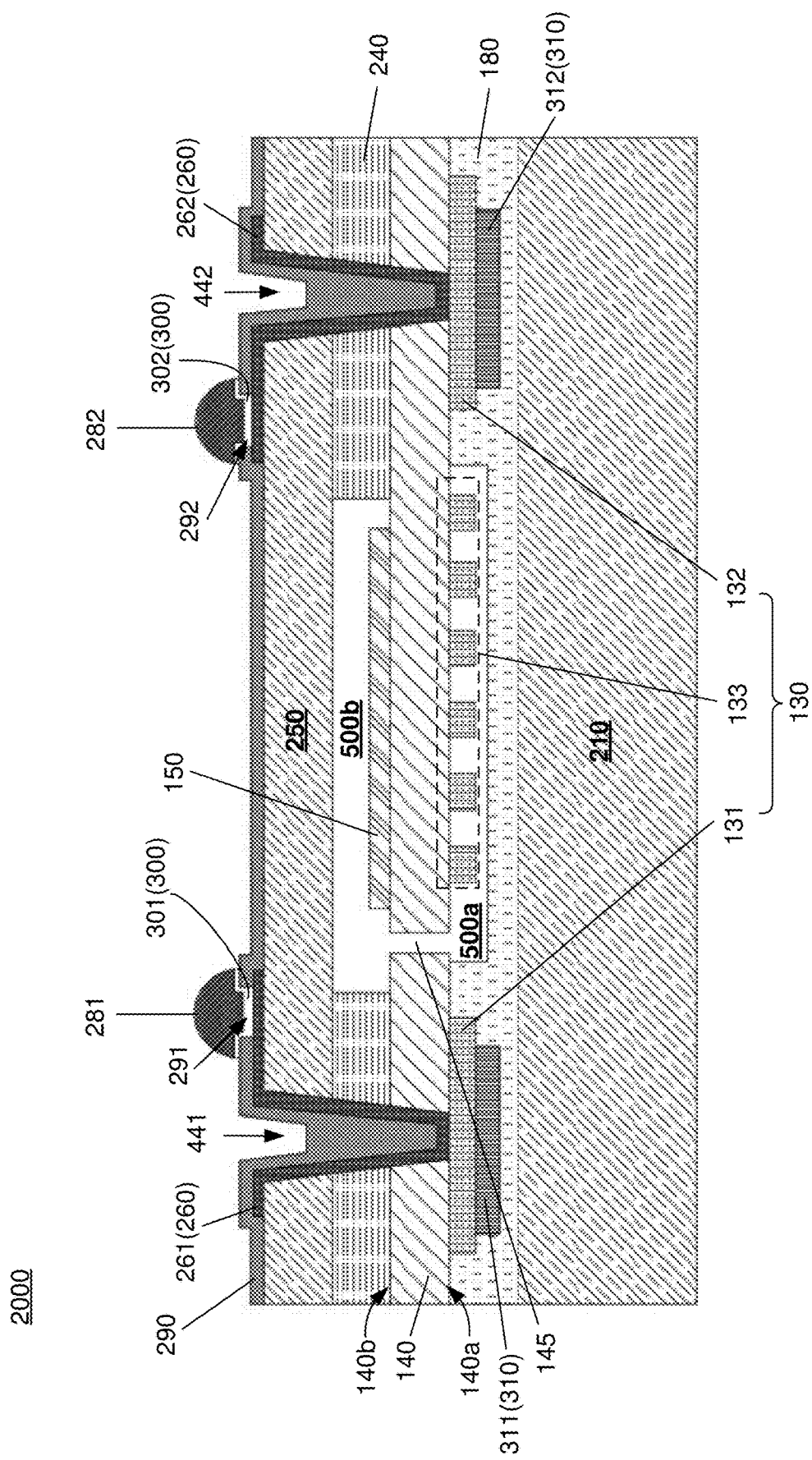
FIG. 5A is a cross-sectional view of a SAW filter, according to an embodiment of the present disclosure.
Figure 5B:
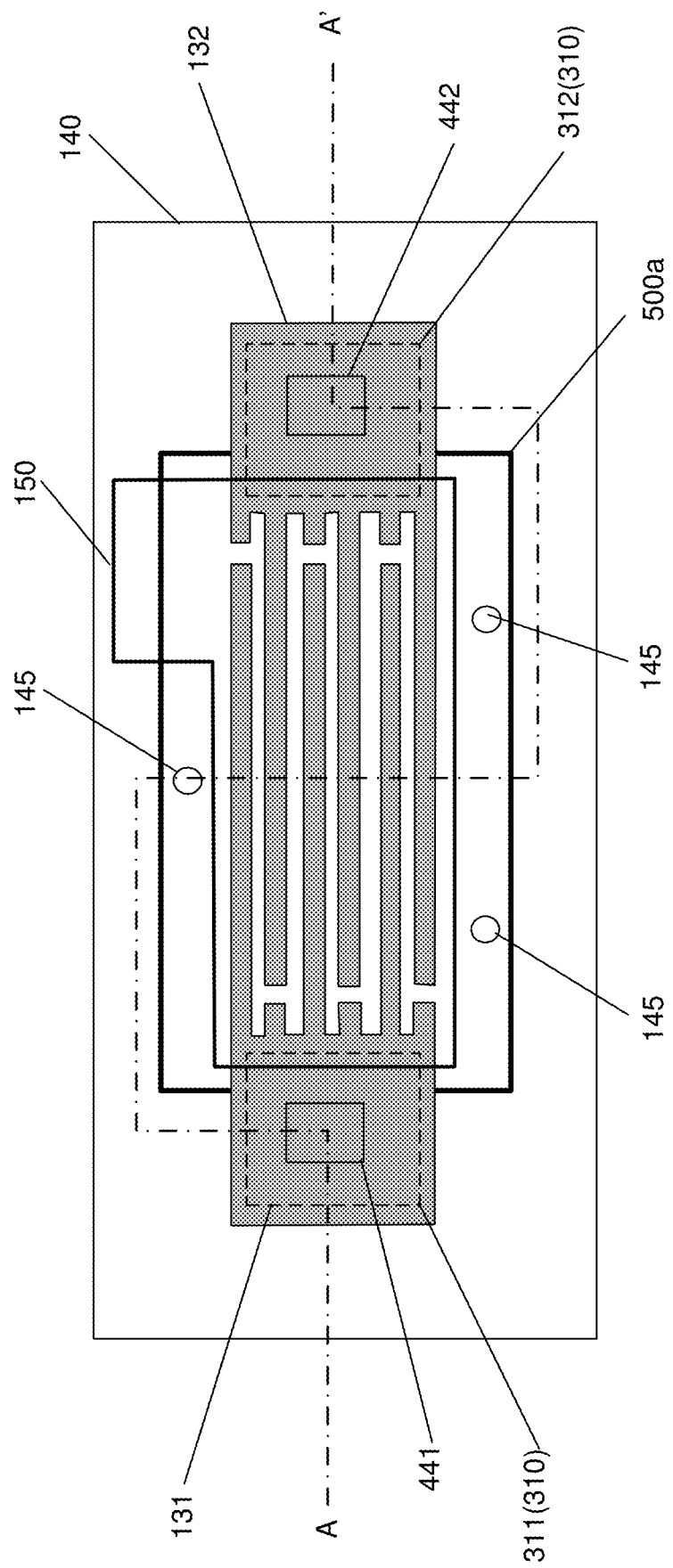
FIG. 5B is a top view showing selected portions of the SAW filter of FIG. 5A, according to an embodiment of the present disclosure.
Figure 5C:
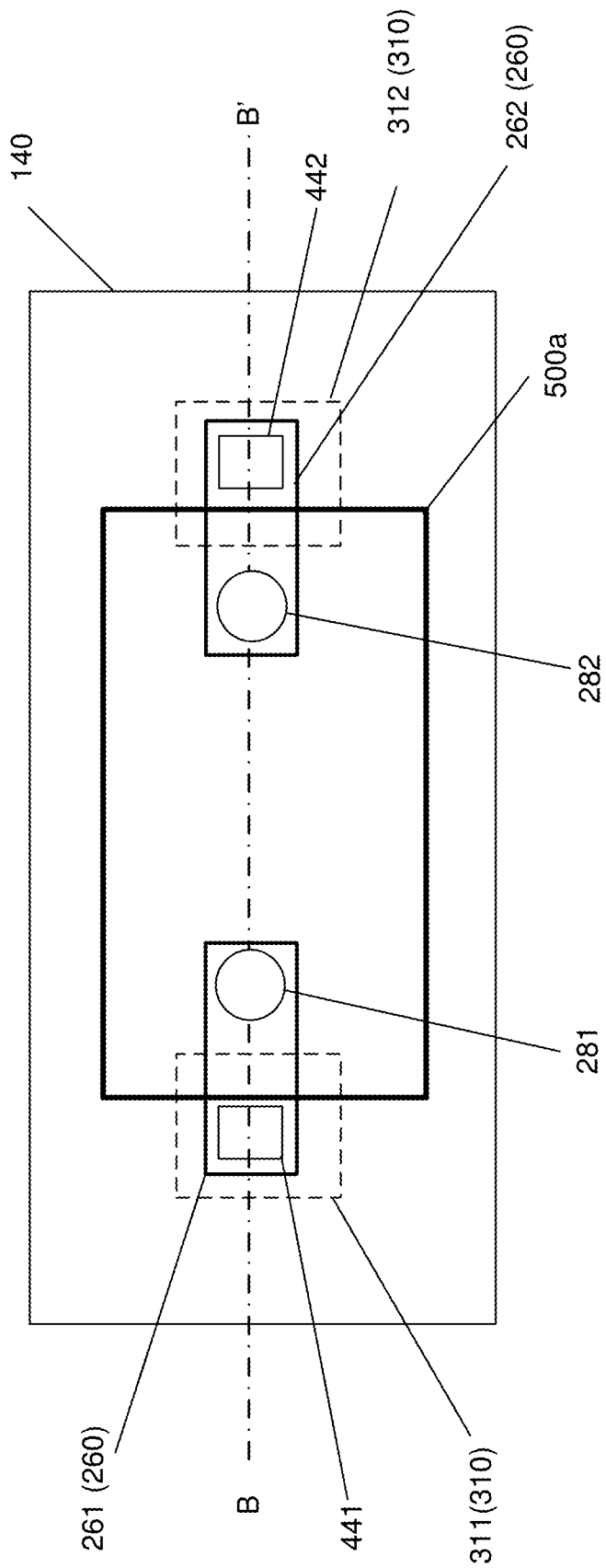
FIG. 5C is a top view showing selected portions of the SAW filter of FIG. 5C, according to an embodiment of the present disclosure.

FIG. 5A is a cross-sectional view of a SAW filter 2000, according to an embodiment of the present disclosure. FIG. 5B is a top view showing selected portions of SAW filter 2000, according to an embodiment of the present disclosure. A cross section of the selected portions in FIG. 5B along line A-A' is illustrated in FIG. 5A. FIG. 5C is a top view showing other selected portions of SAW filter 2000, according to an embodiment of the present disclosure. A cross section of the selected portions in FIG. 5C along line B-B' is illustrated in FIG. 5A. As illustrated in FIGS. 5A, 5B, and 5C, SAW filter 2000 includes a bottom substrate 210, a piezoelectric layer 140 disposed above bottom substrate 210 and having a bottom surface 140a facing bottom substrate 210 and a top surface 140b parallel with and opposite to bottom surface 140a, a lower cavity 500a disposed below piezoelectric layer 140, a back electrode 150 disposed on top surface 140b of piezoelectric layer 140, and an interdigital transducer (IDT) 130 disposed on bottom surface 140a of piezoelectric layer 140. IDT 130 includes a first input and output end 131, a second input and output end 132, and an interdigital portion 133. Interdigital portion 133 of IDT 130 is exposed in lower cavity 500a.

A first dielectric layer 180 is disposed between piezoelectric layer 140 and bottom substrate 210, and surrounding lower cavity 500a. In other words, first dielectric layer 180 and piezoelectric layer 140 together enclose lower cavity 500a. Bottom substrate 210 may be bonded to first dielectric layer 180.

An upper cavity 500b is disposed above piezoelectric layer 140. A top substrate 250 covers upper cavity 500b. A second dielectric layer 240 is disposed between piezoelectric layer 140 and top substrate 250, and surrounds upper cavity 500b. In other words, top substrate 250, second dielectric layer 240, and piezoelectric layer 140 together enclose upper cavity 500b.

A pad metal layer 310 is disposed below IDT 130. A first section 311 of pad metal layer 310 is disposed below a first input and output end 131 of IDT 130, and a second section 312 of the pad metal layer 310 is disposed above a second input and output end 132 of the IDT 130.

One or more release holes 145 are formed in piezoelectric layer 140. The one or more release holes 145 are used for forming lower cavity 500a in an etching and releasing process.

A first TSV 441 and a second TSV 442 are formed in top substrate 250, second dielectric layer 240, and piezoelectric layer 140. First TSV 441 exposes first input and output end 131 of IDT 130, and second TSV 442 exposes second input and output end 132 of IDT 130.

A redistribution metal layer 260 is disposed on top substrate 250. A first section 261 of redistribution metal layer 260 is electrically connected to first input and output end 131 of IDT 130 via first TSV 441, and a second section 262 of redistribution metal layer 260 is electrically connected to second input and output end 132 of IDT 130 via second TSV 442.

A passivation layer 290 is disposed on top substrate 250 and filled in first through silicon via 441 and second through silicon via 442. Passivation layer 290 is formed with a first window 291 exposing first section 261 of redistribution metal layer 260, and a second window 292 exposing second section 262 of redistribution metal layer 260.

An under bump metal (UBM) layer 300 is disposed on passivation layer 290. A first section 301 of UBM layer 300 is disposed above and electrically connected to first section 261 of redistribution metal layer 260 via first window 291, and a second section 302 of UBM layer 300 is disposed above and electrically connected to second section 262 of redistribution metal layer 260 via second window 292.

A first solder bump 281 and a second solder bump 282 are disposed above top substrate 250. First solder bump 281 is disposed above first section 301 of UBM layer 300, and is electrically connected to first section 261 of redistribution metal layer 260 via first section 301 of UBM layer 300. Second solder bump 282 is disposed above second section 302 of UBM layer 300, and is electrically connected to second section 262 of redistribution metal layer 260 via second section 302 of UBM layer 300.

Figure 5D:
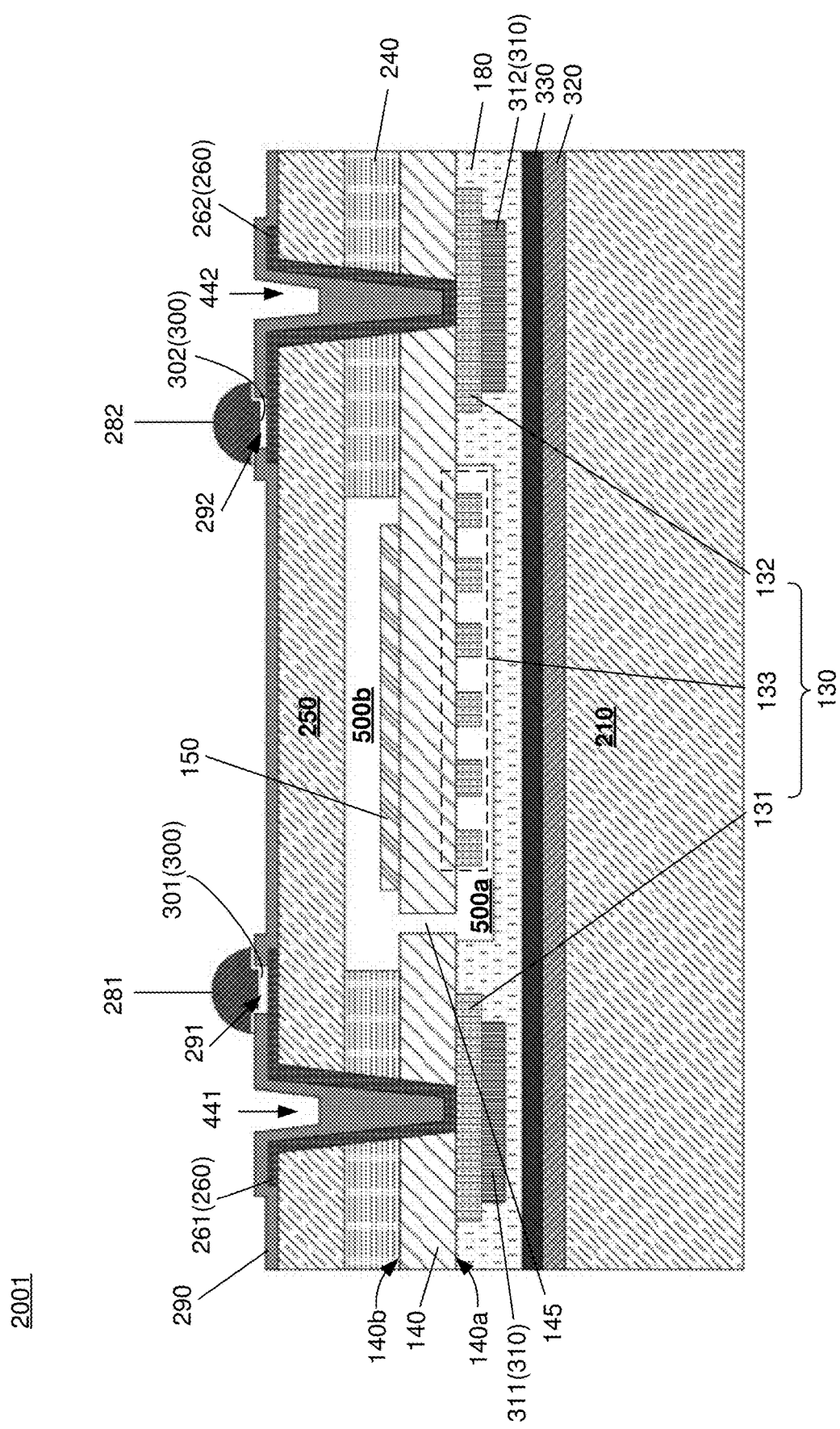
FIG. 5D is a cross-sectional view of a SAW filter, according to an embodiment of the present disclosure.

FIG. 5D is a cross-sectional view of a SAW filter 2001, according to an embodiment of the present disclosure. SAW filter 2001 differs from SAW filter 2000 in that SAW filter 1001 includes a non-conductive layer 320 and a buffer layer 330 disposed between first dielectric layer 180 and bottom substrate 210. Specifically, non-conductive layer 320 is disposed above bottom substrate 210, and buffer layer 330 disposed above non-conductive layer 320. Non-conductive layer 320 may be formed of polysilicon, amorphous silicon, silicon nitride, aluminum nitride, gallium nitride, or a stacked combination of two or more of those materials. Buffer layer 330 may be formed of silicon nitride, silicon oxide, or a stacked combination of those materials.

In some alternative embodiments, a SAW filter may include only one of non-conductive layer 320 and buffer layer 330. For example, a SAW filter may include non-conductive layer 320 disposed between first dielectric layer 180 and bottom substrate 210. Alternatively, a SAW filter may include buffer layer 330 disposed between first dielectric layer 180 and bottom substrate 210.

Except for non-conductive layer 320 and buffer layer 330, the structure and components of SAW filter 2001 are the same as those of SAW filter 2000, and therefore detailed descriptions of the other components of SAW filter 2001 are not repeated.

Figure 6:
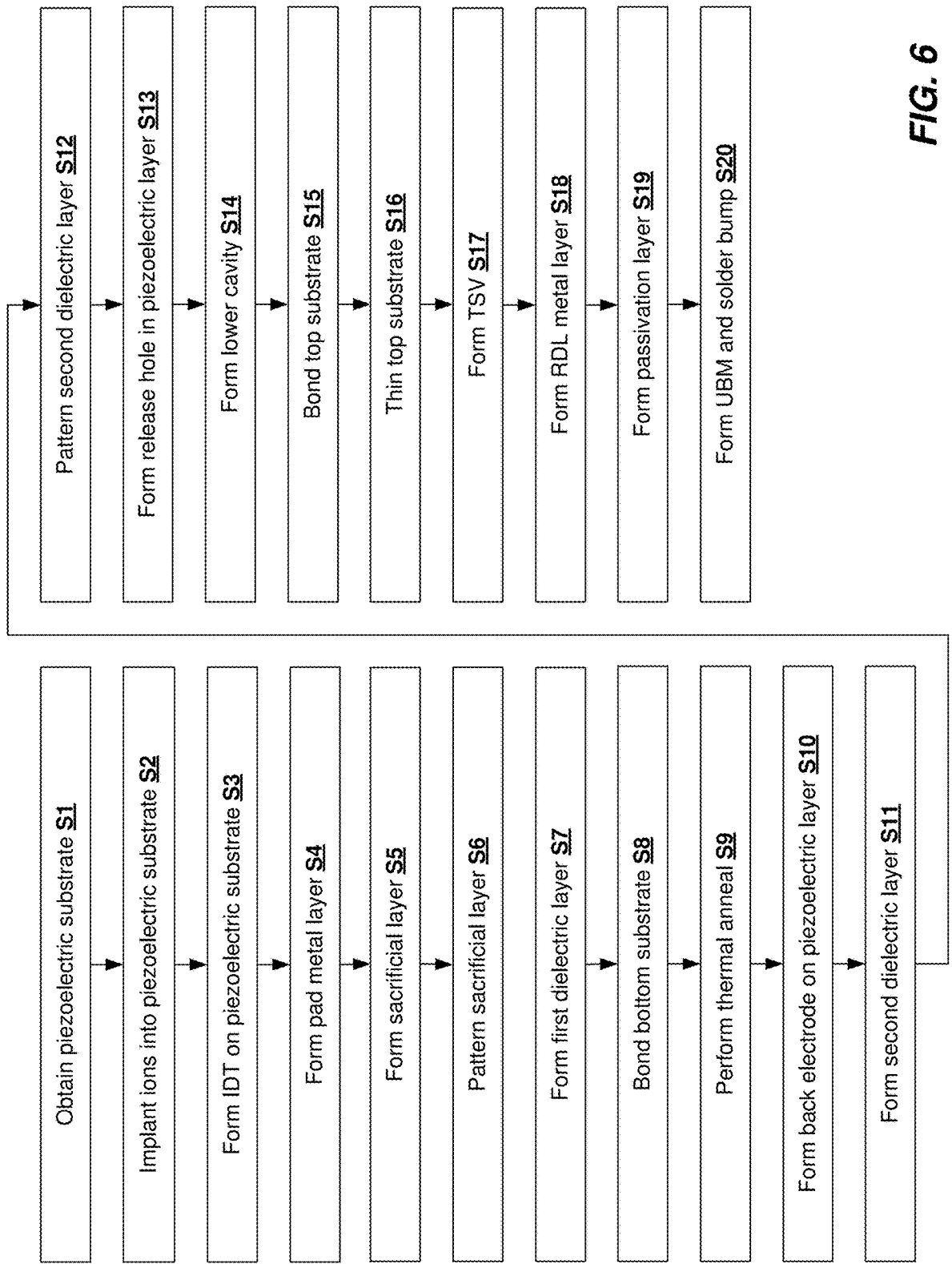
FIG. 6 is a flow chart of a process of fabricating the SAW filter of FIG. 5A, according to an embodiment of the present disclosure.
Figure 7A:
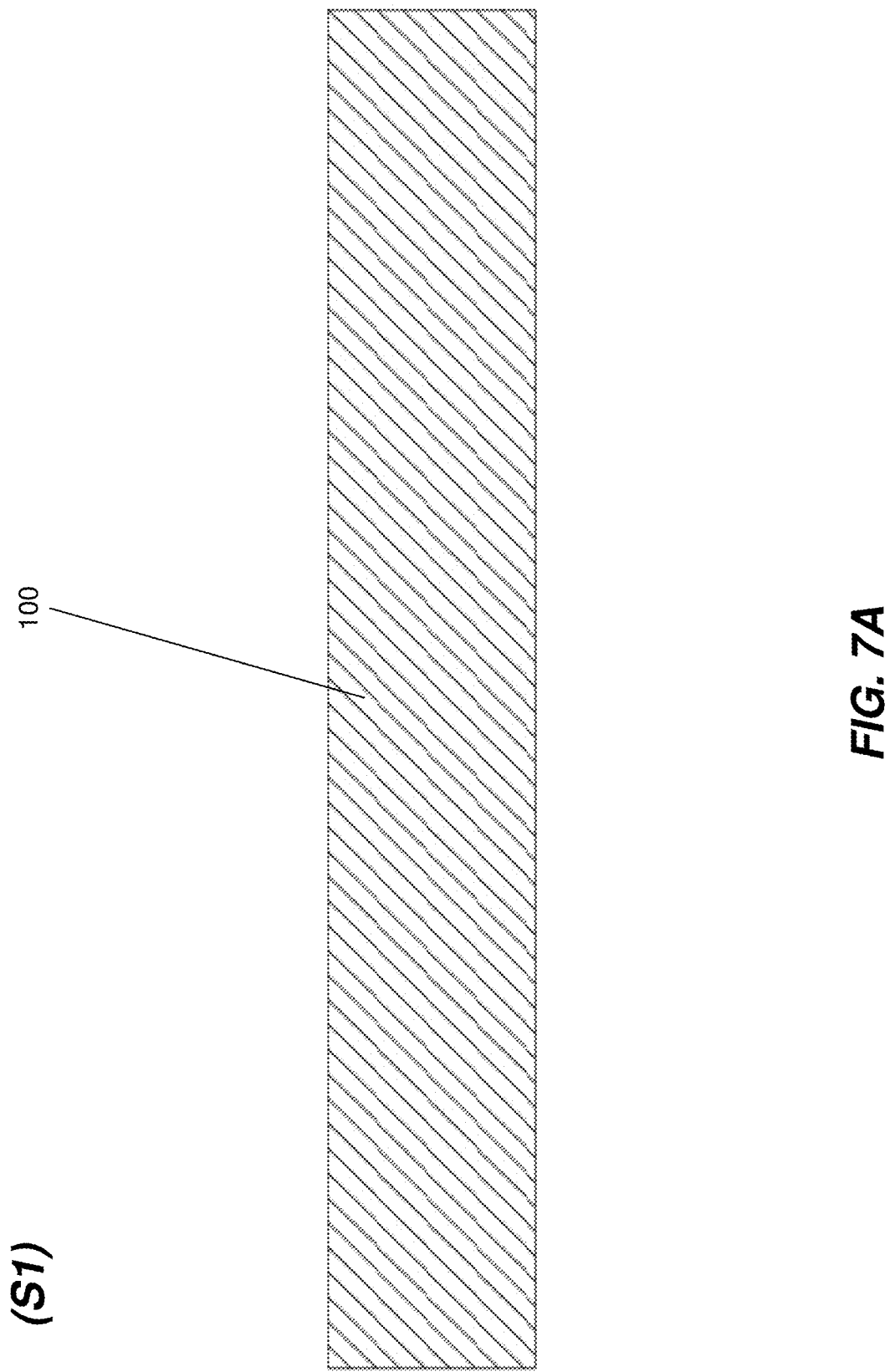
FIGS. 7A-7T are cross-sectional views of structures formed in the process of FIG. 6, according to an embodiment of the present disclosure.

FIG. 6 is a flow chart of a process of fabricating SAW filter 2000, according to an embodiment of the present disclosure. FIGS. 7A-7T are cross-sectional views of structures formed in the process of FIG. 6, according to an embodiment of the present disclosure.

As illustrated in FIG. 7A, in step S1, a piezoelectric substrate 100 is obtained. The piezoelectric substrate may be a lithium niobate or lithium tantalate single crystal substrate.

Figure 7B:
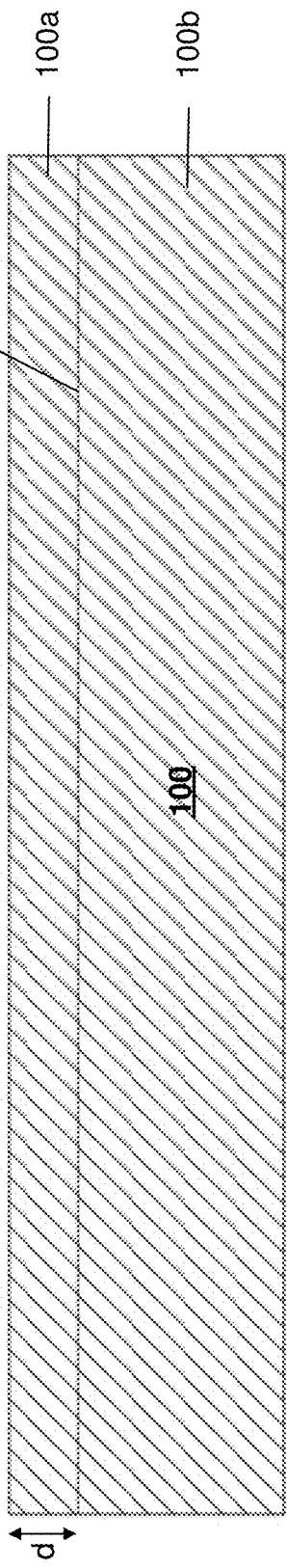

As illustrated in FIG. 7B, in step S2, ions are implanted into piezoelectric substrate 100 at a predetermined implantation depth d, thereby forming an ion layer 101 at depth d of piezoelectric substrate 100. The ions may be helium or hydrogen ions. Implantation depth d may be determined based on a desired thickness of piezoelectric layer 140. For example, implantation depth d may range from approximately 0.3 µm to approximately 10 µm. A first portion 100a of piezoelectric substrate 100 is disposed above ion layer 101, and a second portion 100b of piezoelectric substrate 100 is disposed below ion layer 101.

Figure 7C:
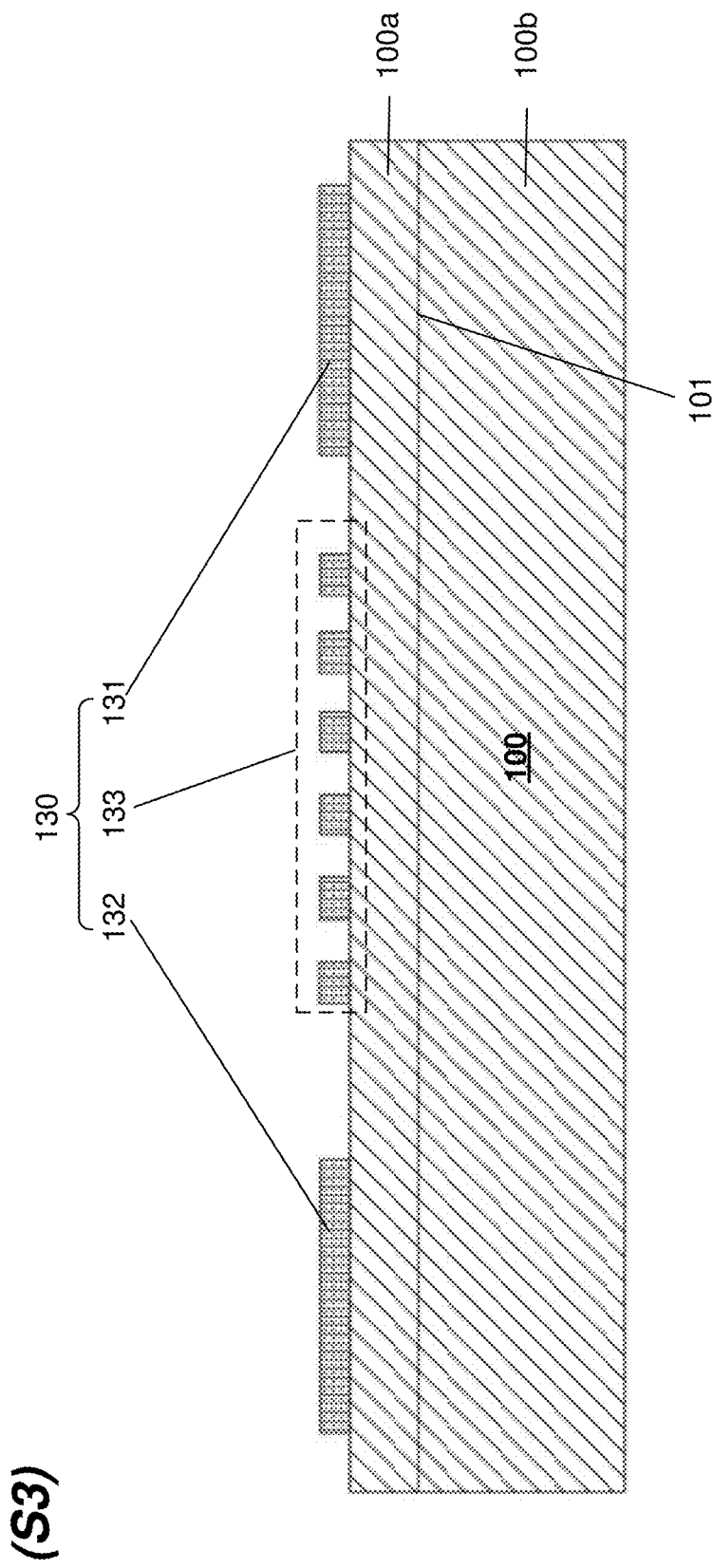

As illustrated in FIG. 7C, in step S3, IDT 130 is formed on first portion 100a of piezoelectric substrate 100. IDT 130 includes first input and output end 131, second input and output end 132, and interdigital portion 133 disposed between first and second input and output ends 131 and 132.

Figure 7D:
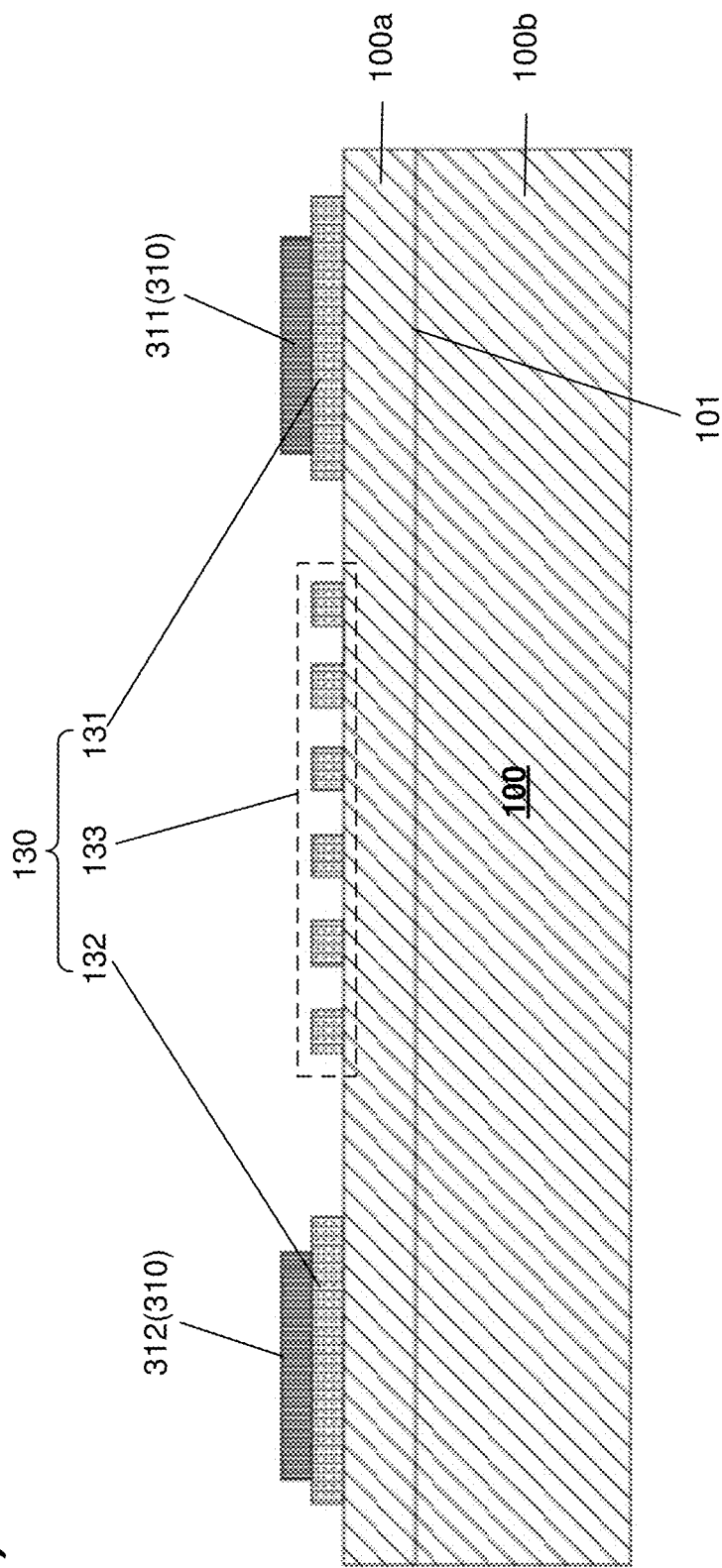

As illustrated in FIG. 7D, in step S4, a pad metal layer 310 is formed on IDT 130. Then, pad metal layer 310 is patterned to form first section 311 disposed above and electrically connected to first input and output end 131 of IDT 130, and second section 312 disposed above and electrically connected to second input and output end 132 of IDT 130.

Figure 7E:
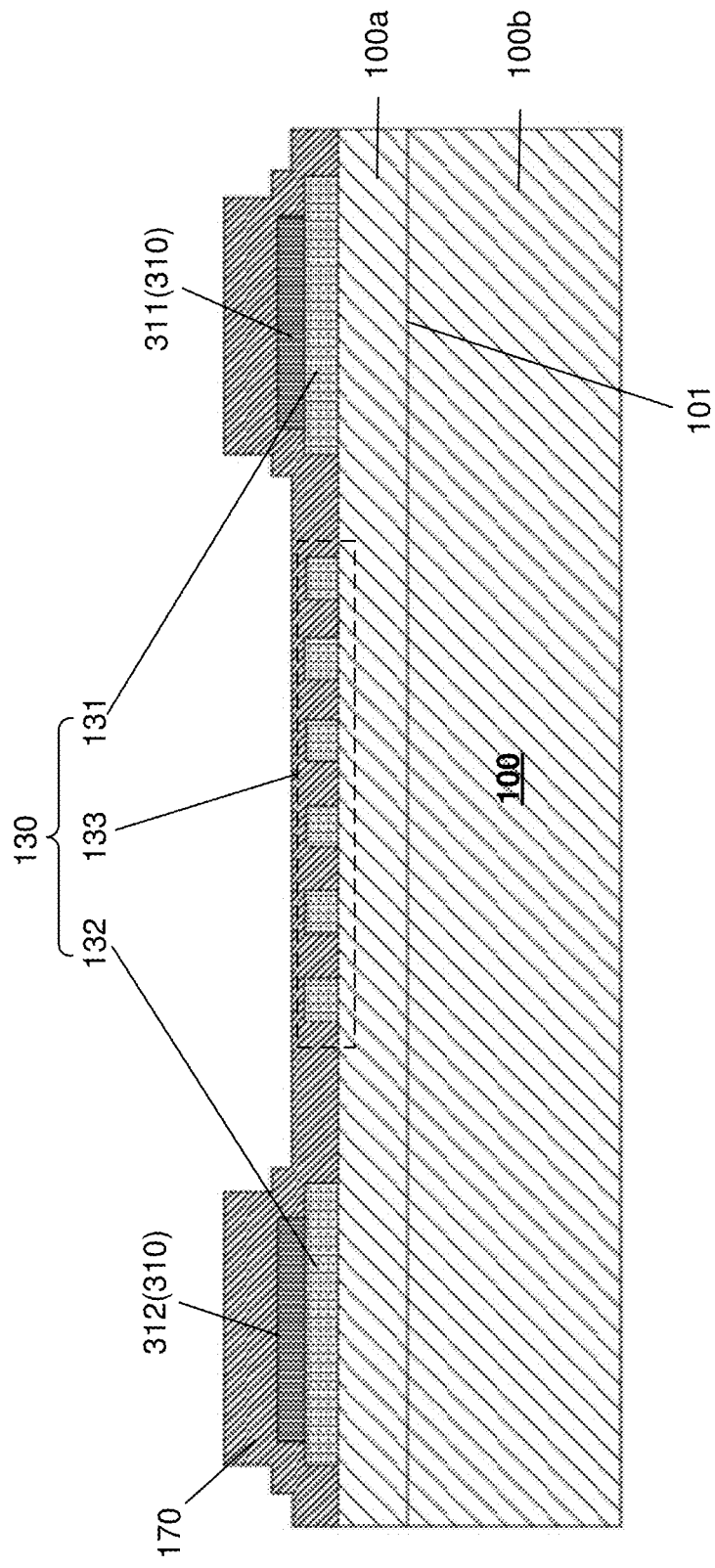

As illustrated in FIG. 7E, in step S5, sacrificial layer 170 is deposited on first portion 100a of piezoelectric substrate 100, covering IDT 130 and pad metal layer 310. Sacrificial layer 170 may include Si, such as amorphous Si or polysilicon.

Figure 7F:
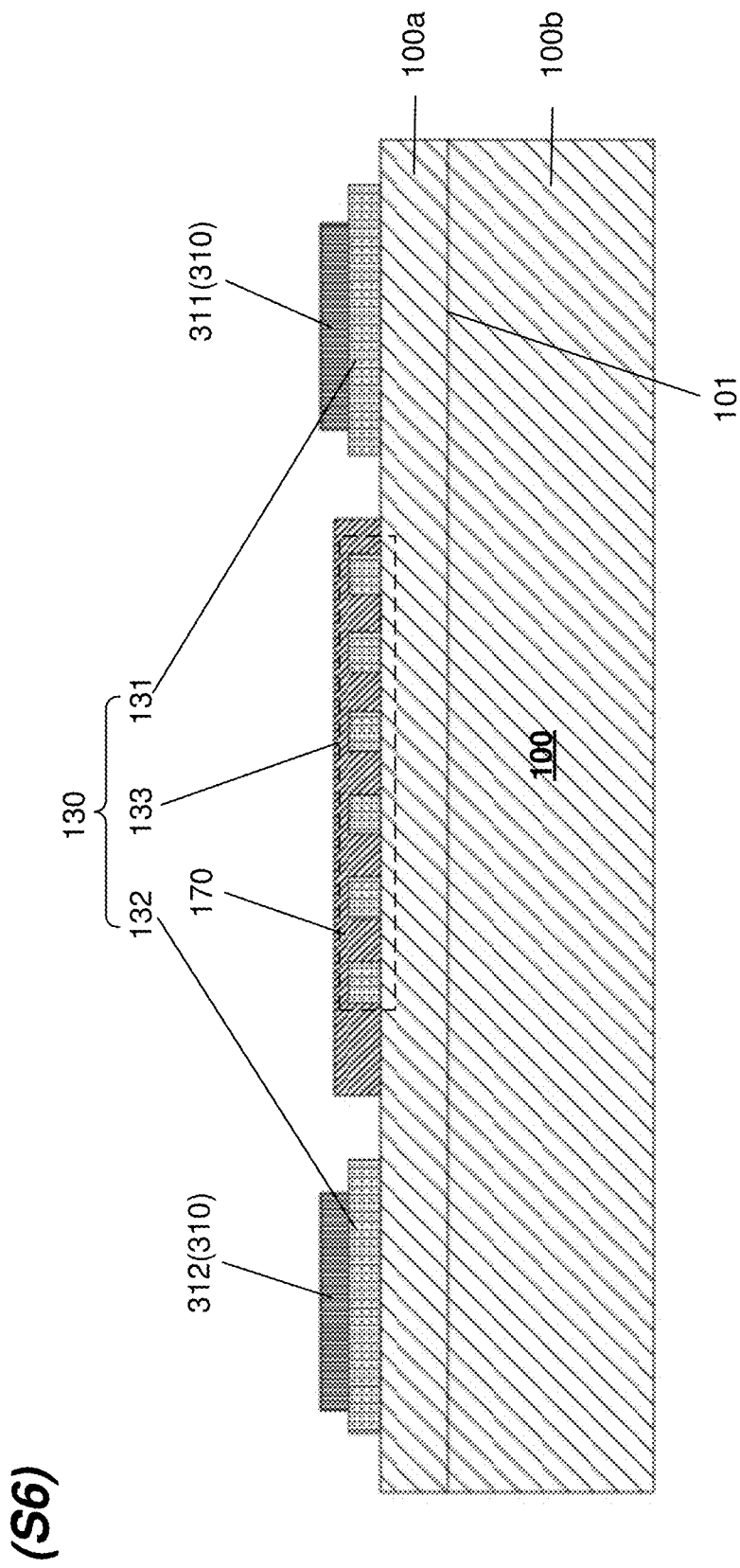

As illustrated in FIG. 7F, in step S6, sacrificial layer 170 is patterned by etching. The patterned sacrificial layer 170 covers interdigital portion 133 of IDT 130. An area of patterned sacrificial layer 170 is greater than an area of interdigital portion 133 of IDT 130. Sacrificial layer 170 will be removed during a subsequent etching and releasing process, thereby forming lower cavity 500a.

Figure 7G:
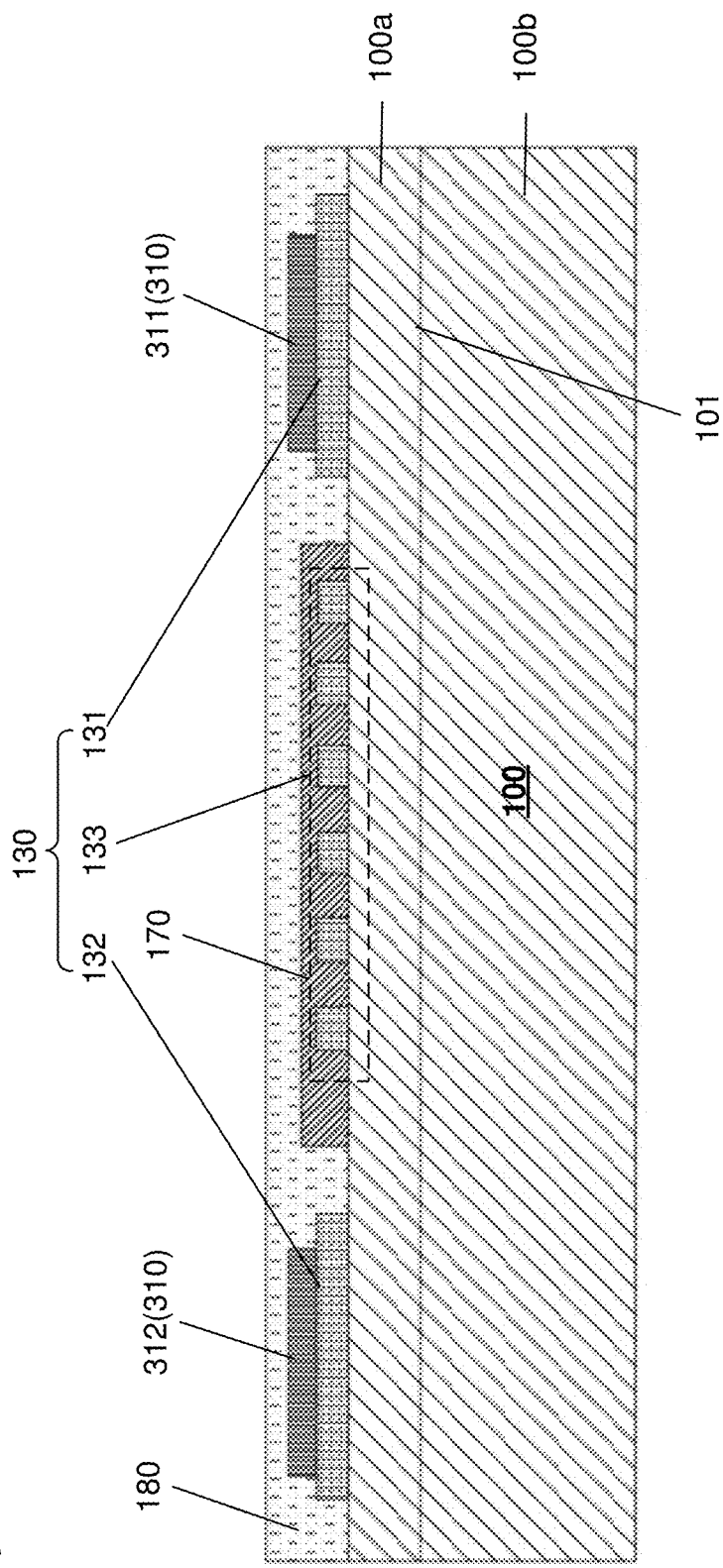

As illustrated in FIG. 7G, in step S7, first dielectric layer 180 is deposited on first portion 100a of piezoelectric substrate 100, covering sacrificial layer 170, IDT 130, and pad metal layer 310. Then, surface planarization and polishing are performed on first dielectric layer 180, by using a chemical mechanical polishing (CMP) process. The planarized first dielectric layer 180 still covers sacrificial layer 170.

Figure 7H:
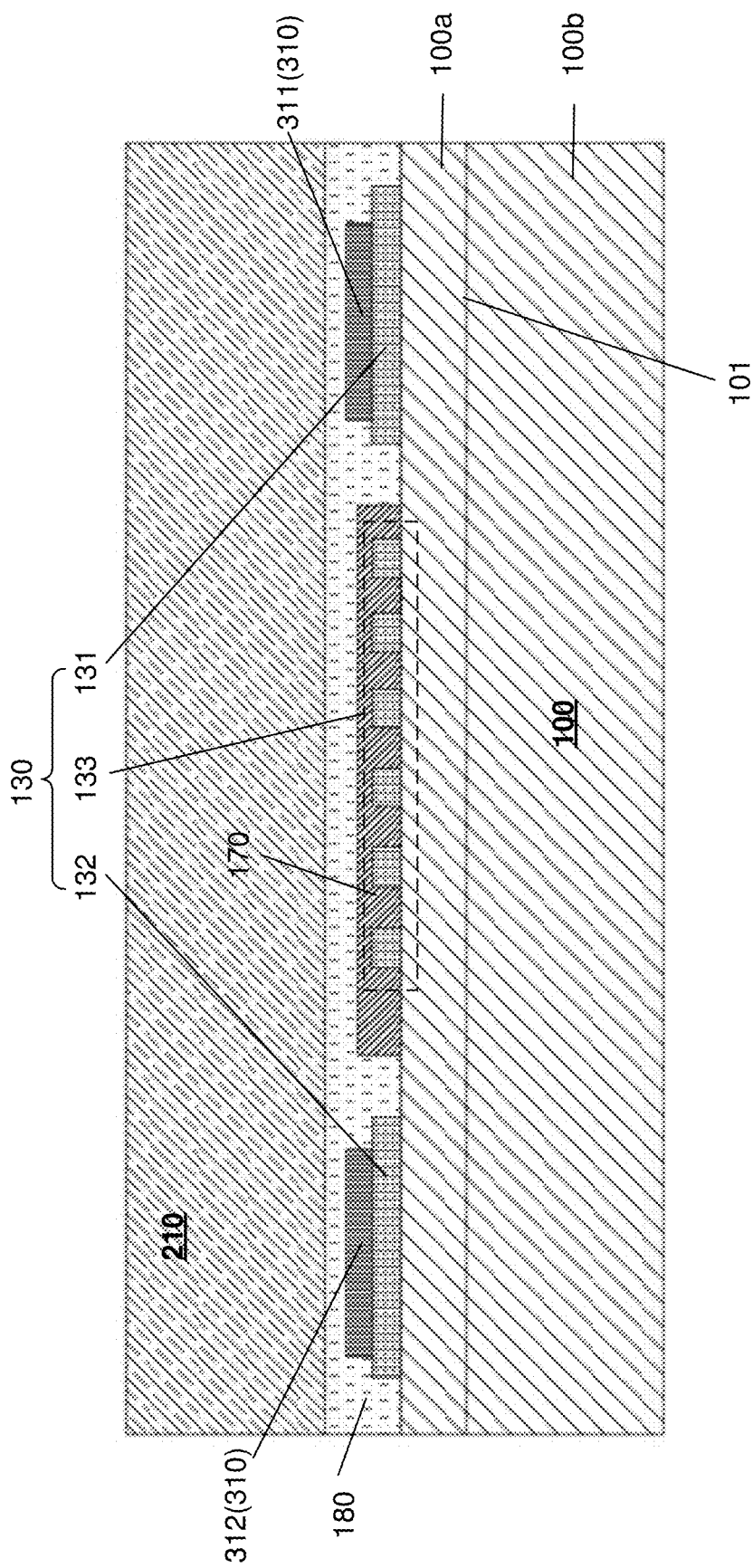
Figure 71:
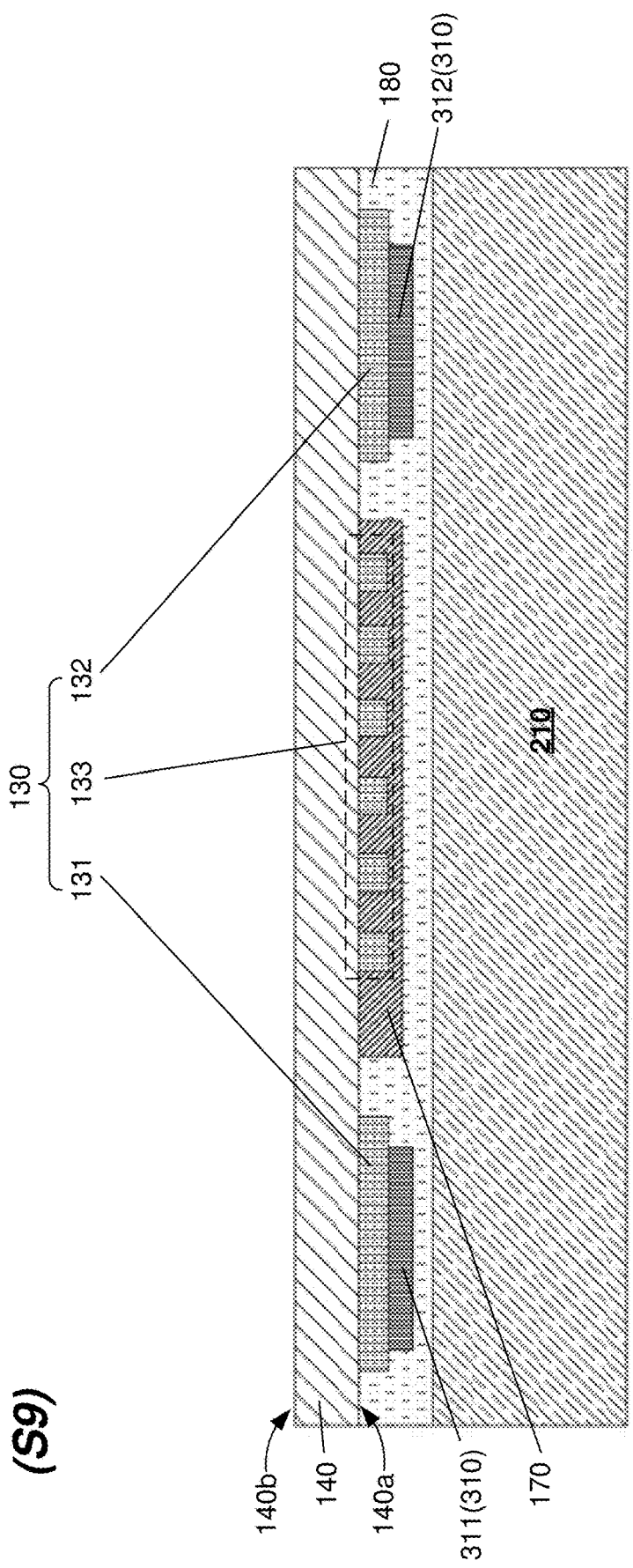

As illustrated in FIG. 7H, in step S8, bottom substrate 210 is bonded to first dielectric layer 180. Bottom substrate 210 may include Si, $SiO_2$, polysilicon, silicon carbide, sapphire ($Al_2O_3$), or a stacked combination of two or more of those materials.

As illustrated in FIG. 7I, in step S9, the structure shown in FIG. 7H is flipped over and a thermal anneal is performed on the structure. The annealing temperature may range from approximately 400° C. to approximately 650° C. As a result of thermal anneal, ion layer 101 in piezoelectric substrate 100 is broken. Second portion 100b of piezoelectric substrate 100 below ion layer 101 is removed, while first portion 100a of piezoelectric substrate 100 above ion layer 101 remains. First portion 100a of piezoelectric substrate 100 constitutes piezoelectric layer 140 in SAW filter 1000. Piezoelectric layer 140 has bottom surface 140a where IDT 130 is formed, and top surface 140b exposed. A CMP polishing may be performed on the exposed top surface 140b of piezoelectric layer 140 to obtain a smooth surface, and to achieve the desired thickness of piezoelectric layer 140 in SAW filter 1000. In some embodiments, an ion beam etching (IBE) or ion beam milling process may be performed on piezoelectric layer 140 to achieve a more uniform thickness.

Figure 7J:
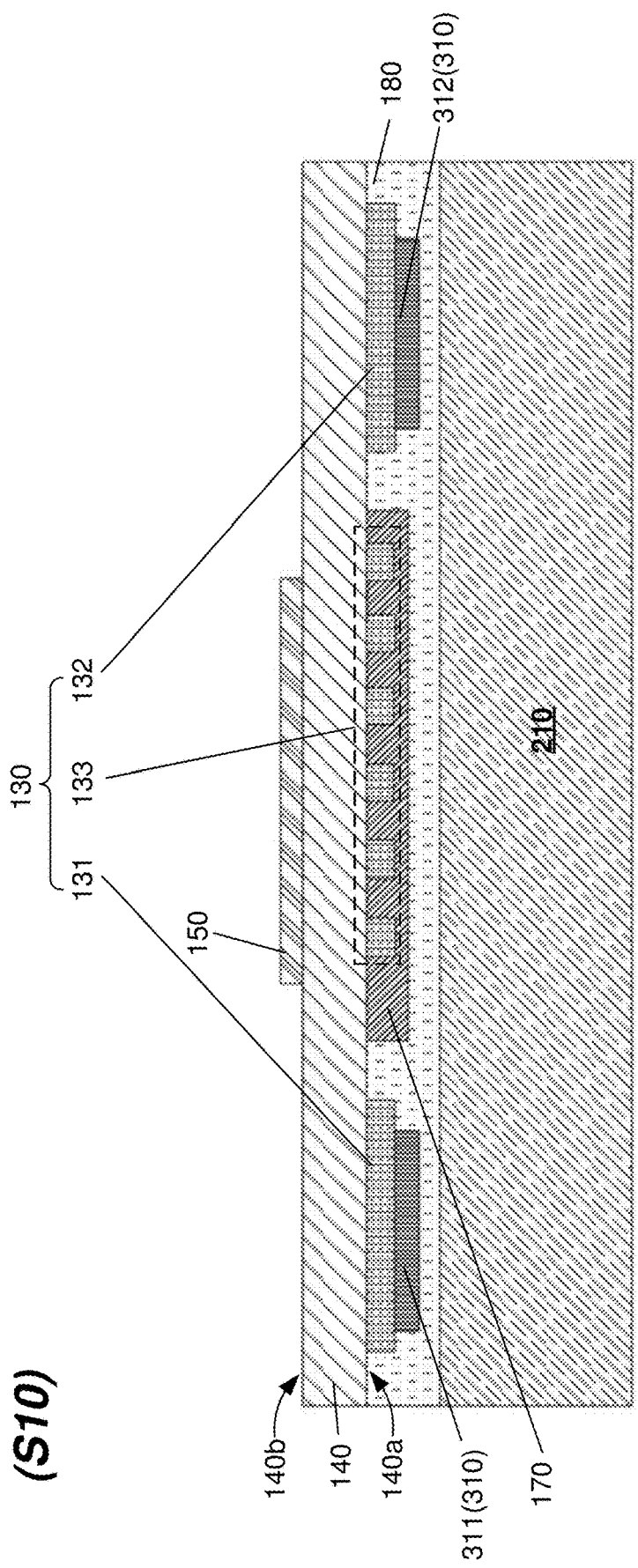

As illustrated in FIG. 7J, in step S10, back electrode 150 is formed on piezoelectric layer 140. Back electrode 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. Back electrode 150 is vertically aligned with interdigital portion 133 of IDT 130.

Figure 7K:
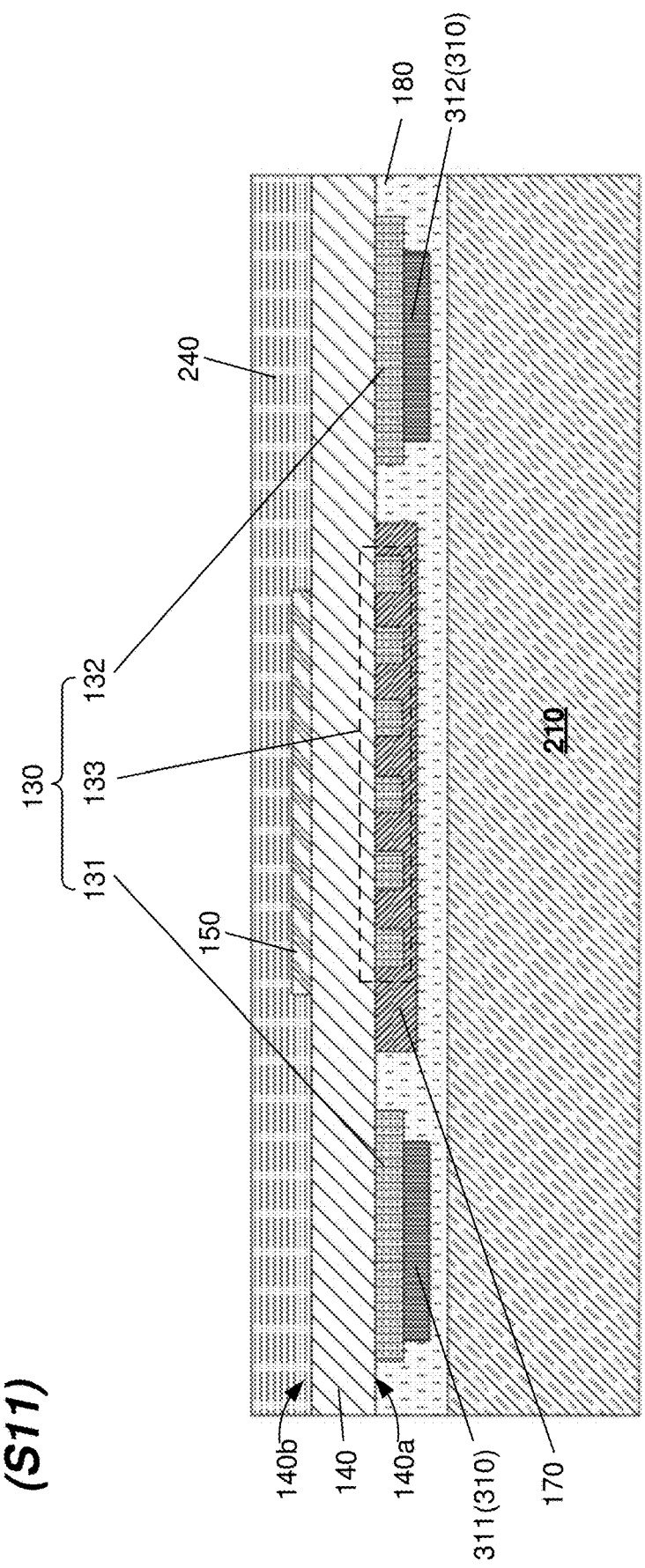

As illustrated in FIG. 7K, in step S11, second dielectric layer 240 is deposited on piezoelectric layer 140, covering back electrode 150. Second dielectric layer 240 may be formed of silicon oxide, silicon nitride, or a stacked combination of those materials. Second dielectric layer 240 may be deposited by using a chemical vapor deposition (CVD) process or a physical vapor deposition (PVD) process. A CMP planarization process may be performed on second dielectric layer 240, such that a top surface of second dielectric layer 240 is parallel to top surface 140b of piezoelectric layer 140.

Figure 7L:
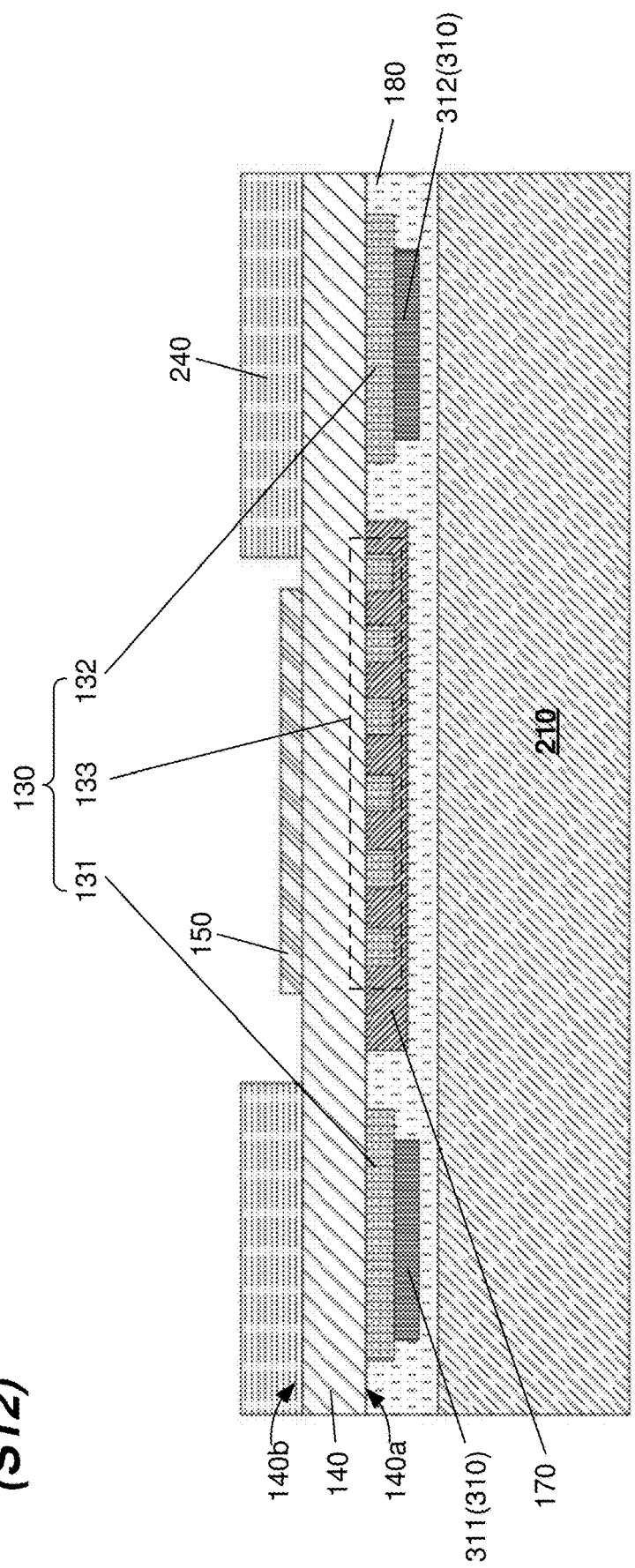

As illustrated in FIG. 7L, in step S12, second dielectric layer 240 is patterned by etching. As a result of the patterning, a portion of second dielectric layer 240 is removed to expose an entirety or a portion of back electrode 150 and a portion of piezoelectric layer 140. An area of the removed portion of second dielectric layer 240 is greater than an area of interdigital portion 133 of IDT 130.

Figure 7M:
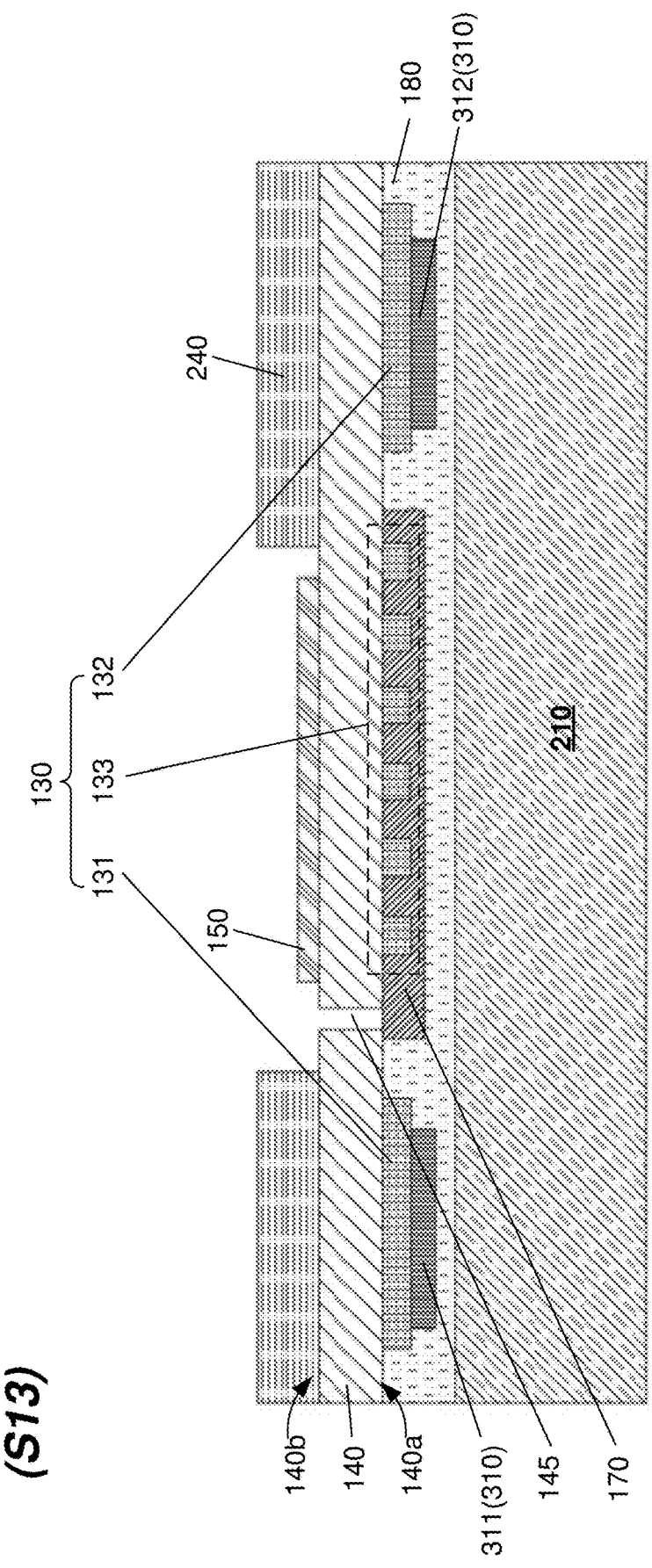

As illustrated in FIG. 7M, in step S13, the portion of piezoelectric layer 140 exposed by second dielectric layer 240 is etched to form one or more release holes 145 through piezoelectric layer 140. Each release hole 145 exposes a portion of sacrificial layer 170.

Figure 7N:
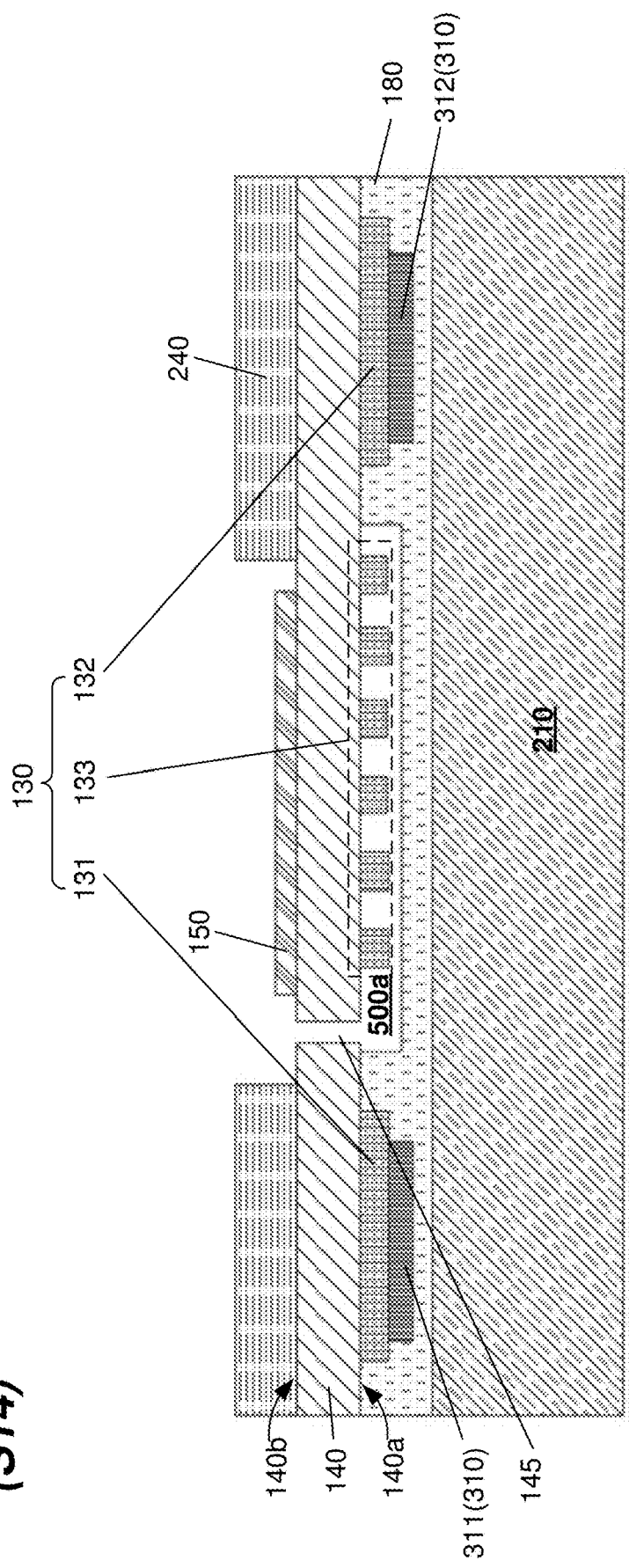
Figure 70:
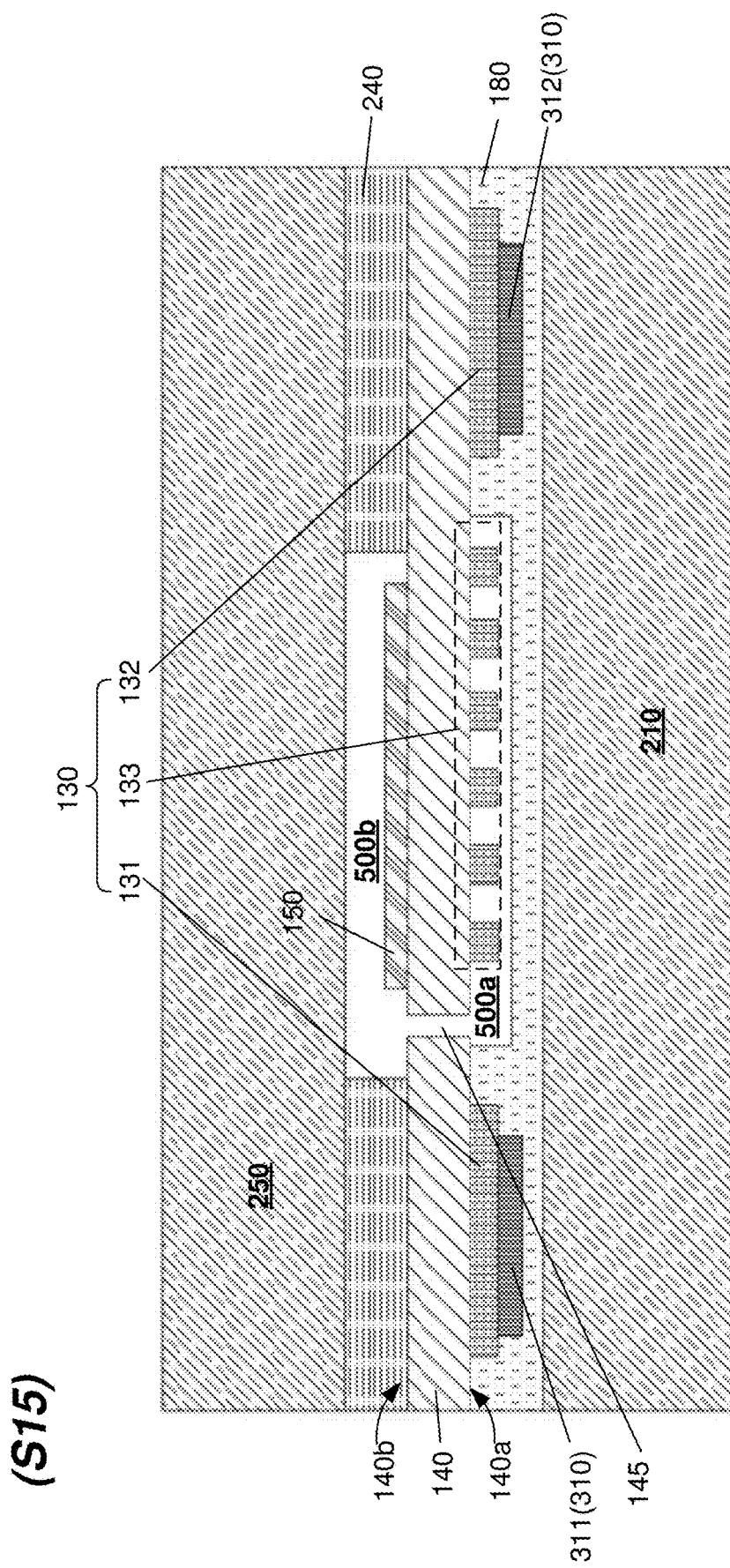

As illustrated in FIG. 7N, in step S14, sacrificial layer 170 is etched and released to form lower cavity 500a below interdigital portion 133 of IDT 130. Sacrificial layer 170 may be etched by a dry etch process using XeF$_2$ plasma. The etchant and etching products of the etching process may be released through the one or more release holes 145.

As illustrated in FIG. 7O, in step S15, top substrate 250 is bonded to second dielectric layer 240. Top substrate 250, second dielectric layer 240, and piezoelectric layer 140 together enclose upper cavity 500b. Top substrate 250 may include Si, SiO$_2$, polysilicon, silicon carbide, sapphire (Al$_2$O$_3$), or a stacked combination of two or more of those materials.

Figure 7P:
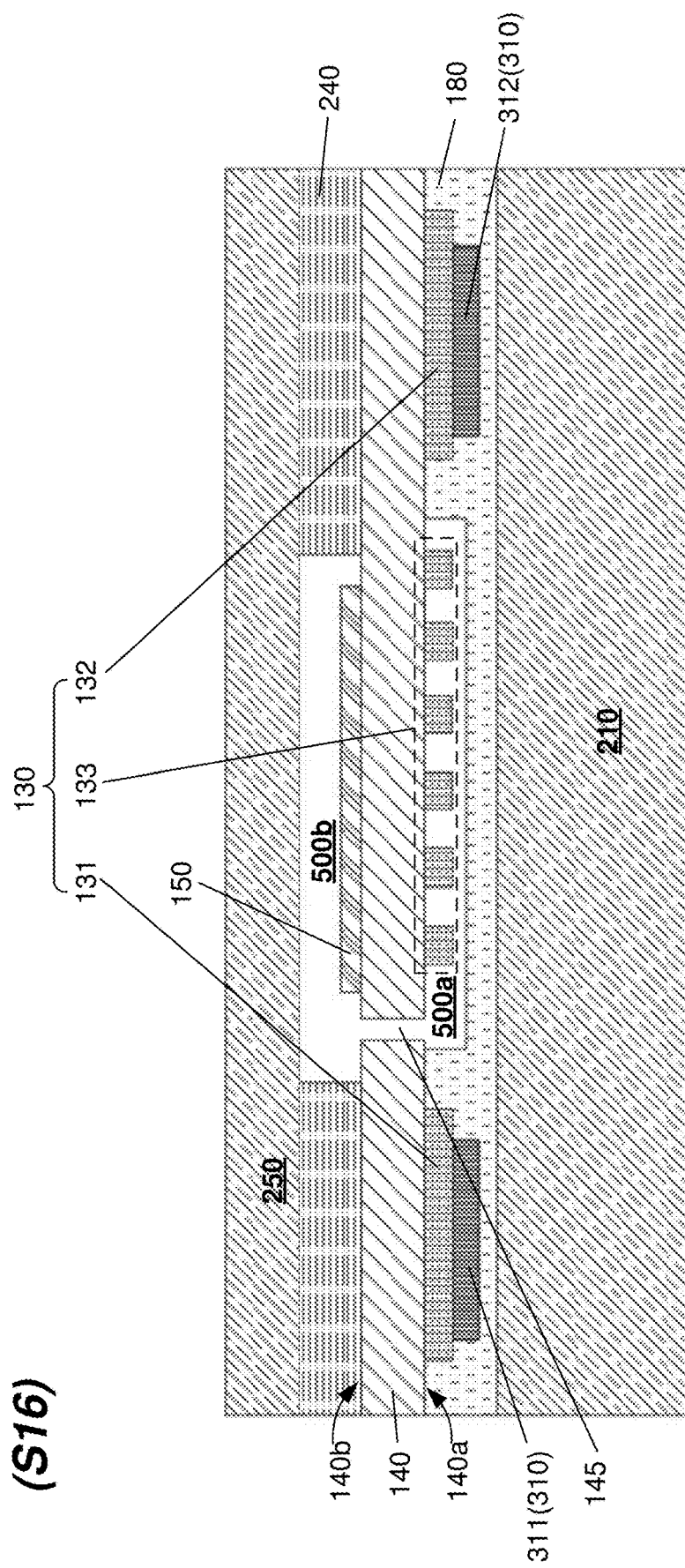

As illustrated in FIG. 7P, in step S16, top substrate 250 is thinned to a predetermined thickness.

Figure 7Q:
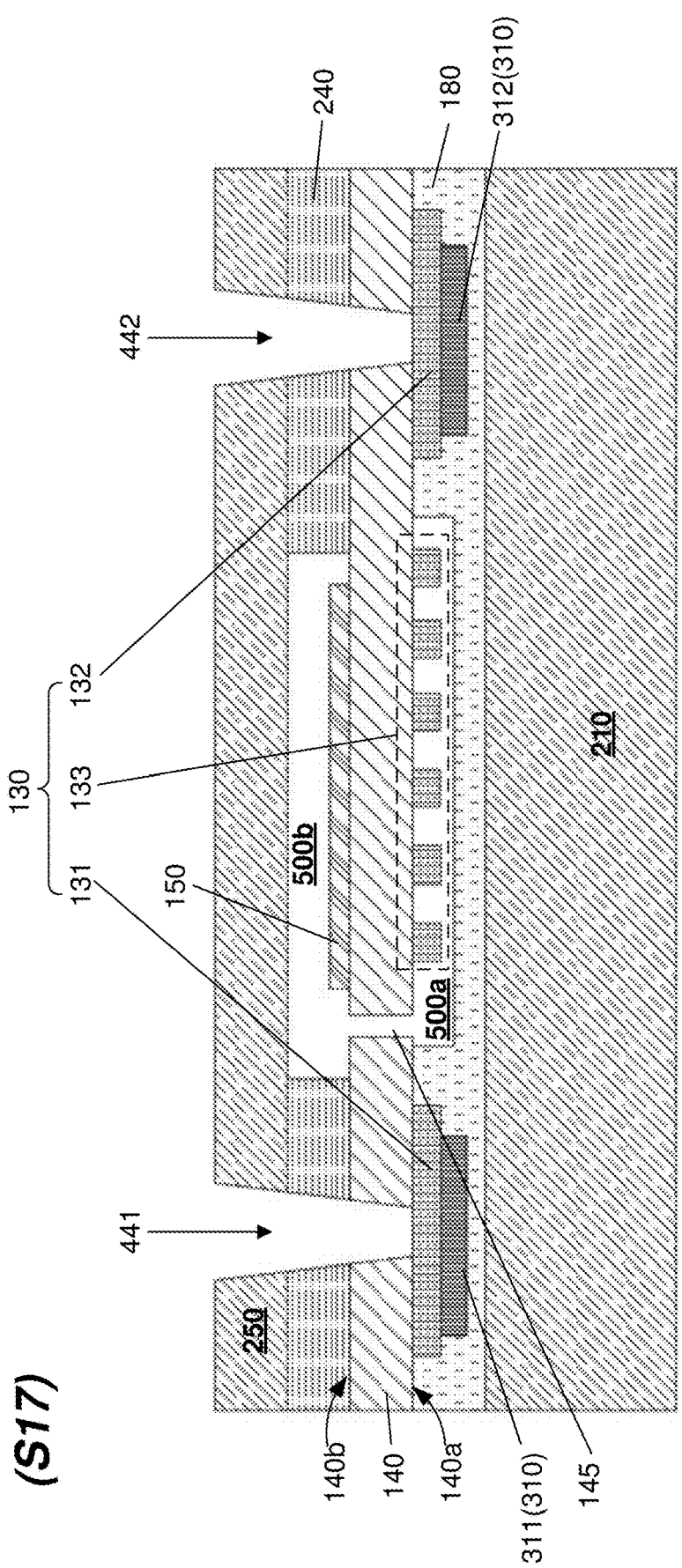

As illustrated in FIG. 7Q, in step S17, first TSV 441 and second TSV 442 are formed in top substrate 250, second dielectric layer 240, and piezoelectric layer 140. First TSV 441 exposes first input and output end 131 of IDT 130, and second TSV 442 exposes second input and output end 132 of IDT 130.

Figure 7R:
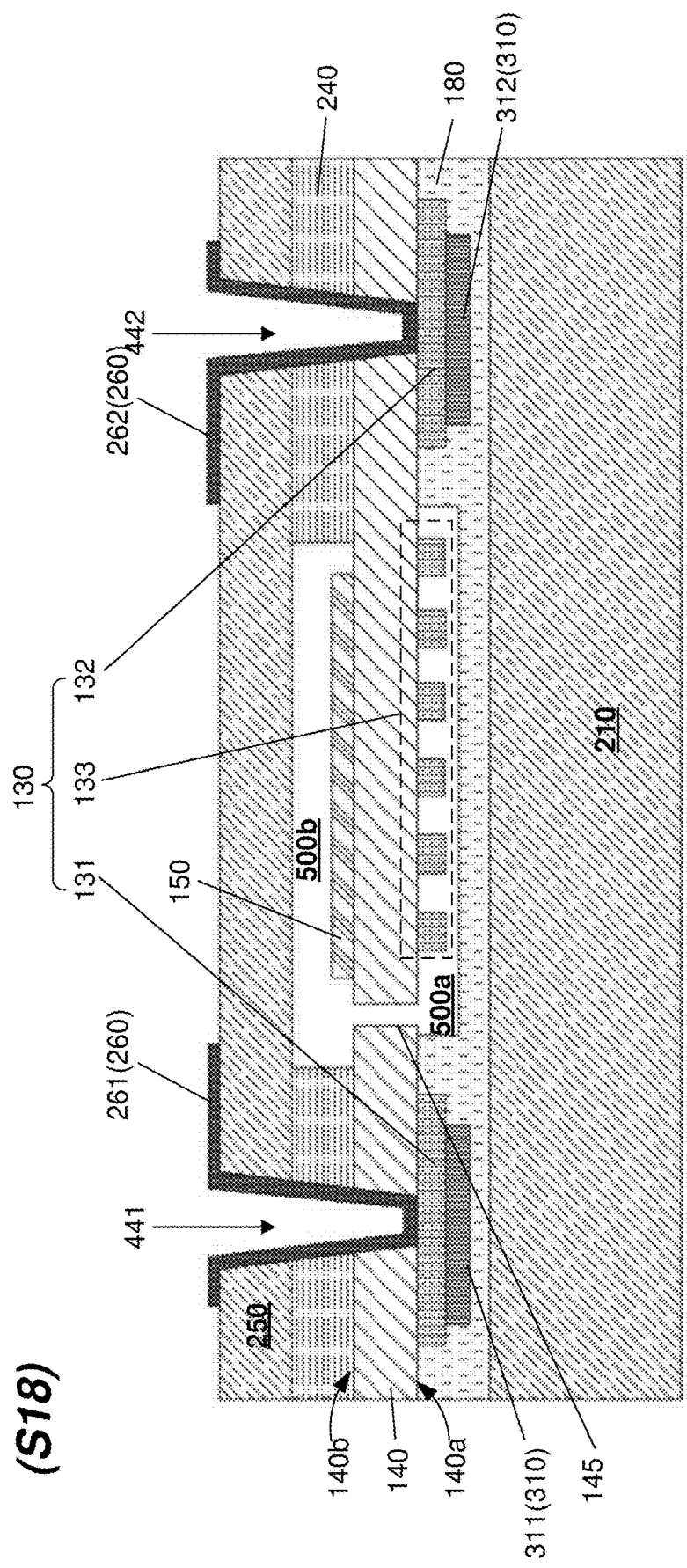

As illustrated in FIG. 7R, in step S18, redistribution metal layer 260 is formed on top substrate 250 and within first and second TSVs 441 and 442. The redistribution metal layer 260 is patterned to form first section 261 contacting and electrically connected to first input and output end 131 of IDT 130 via first TSV 441, and second section 262 contacting and electrically connected to second input and output end 132 of IDT 130 via second TSV 442.

Figure 7S:
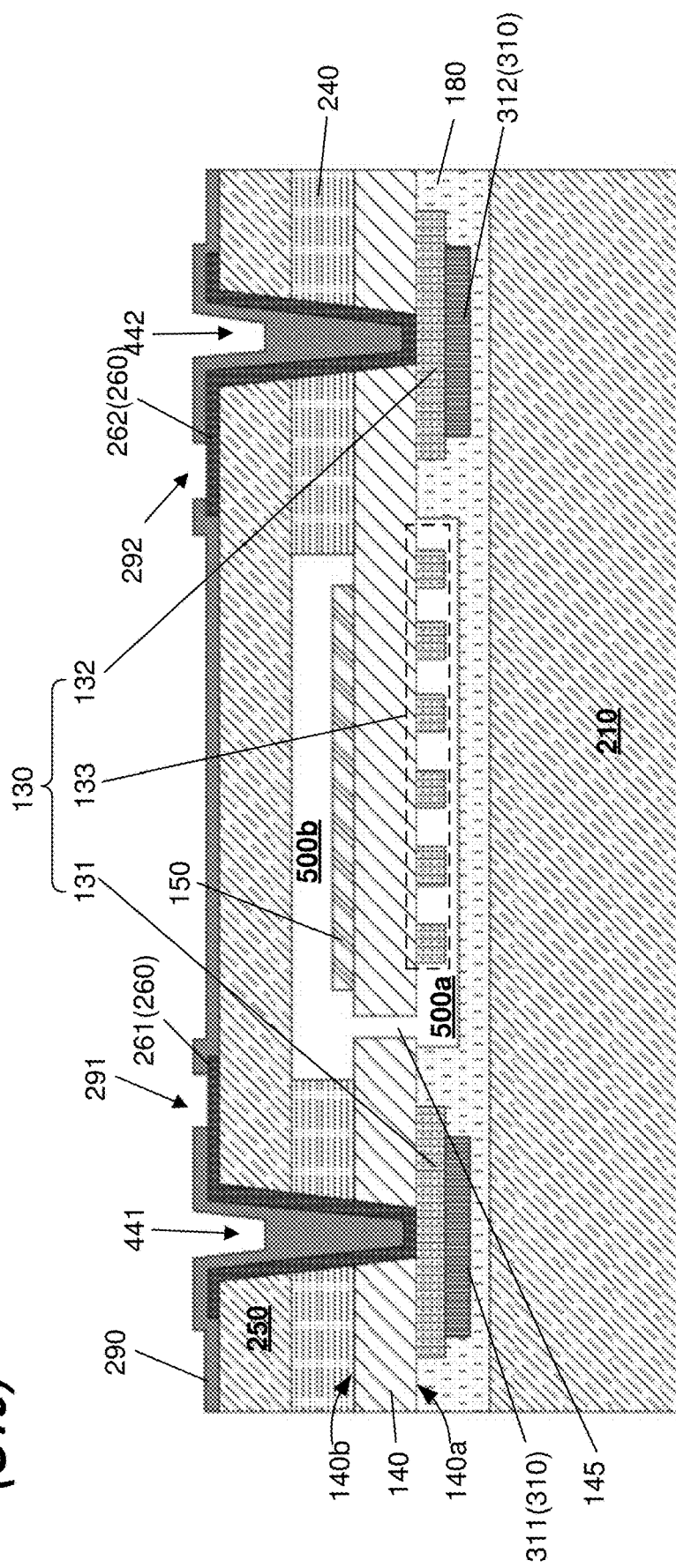
Figure 7T:
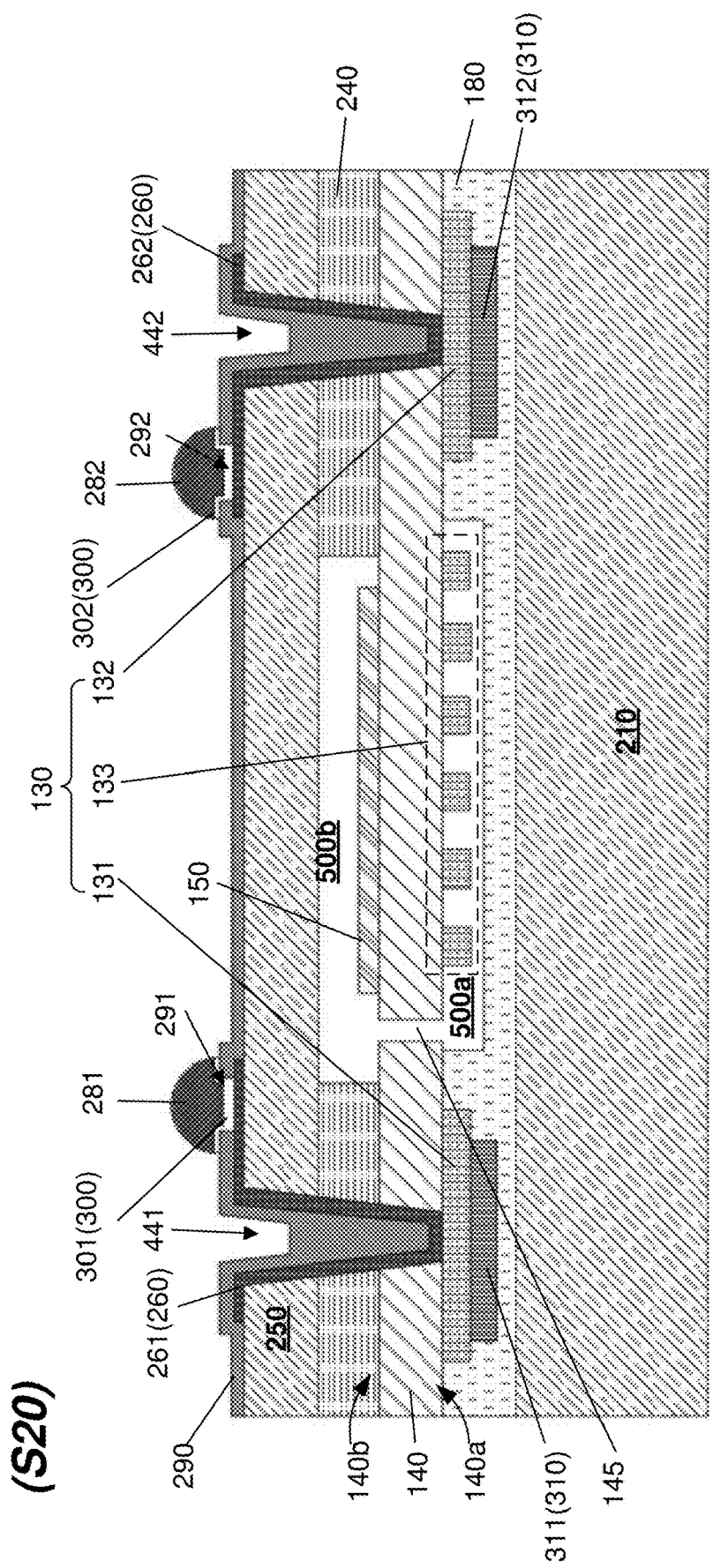

As illustrated in FIG. 7S, in step S19, passivation layer 290 is formed on top substrate 250 and covering redistribution metal layer 260. Then, passivation layer 290 is etched to form a first window 291 exposing a portion of first section 261 of redistribution metal layer 260 and a second window 292 exposing a portion of second section 262 of redistribution metal layer 260. Passivation layer 290 may include an organic material such as, for example, polyimide. First window 291 is not vertically aligned with first TSV 441, and second window 292 is not vertically aligned with second TSV 442.

As illustrated in FIG. 7T, in step S20, UBM layer 300 is formed on passivation layer 290. UBM layer 300 is patterned to form first section 301 contacting the exposed portion of first section 261 of redistribution metal layer 260 via first window 291 of passivation layer 290, and second section 302 contacting the exposed portion of second section 262 of redistribution metal layer 260 via second window 292 of passivation layer 290. Afterwards, first solder bump 281 is formed on and contacts first section 301 of UBM layer 300, and second solder bump 282 is formed on and contacts second section 302 of UBM layer 300. As a result, first solder bump 281 is electrically connected to first input and output end 131 of IDT 130, and second solder bump 282 is electrically connected to second input and output end 132 of IDT 130. Thus, SAW filter 2000 illustrated in FIG. 5A is fabricated.

Figure 8:
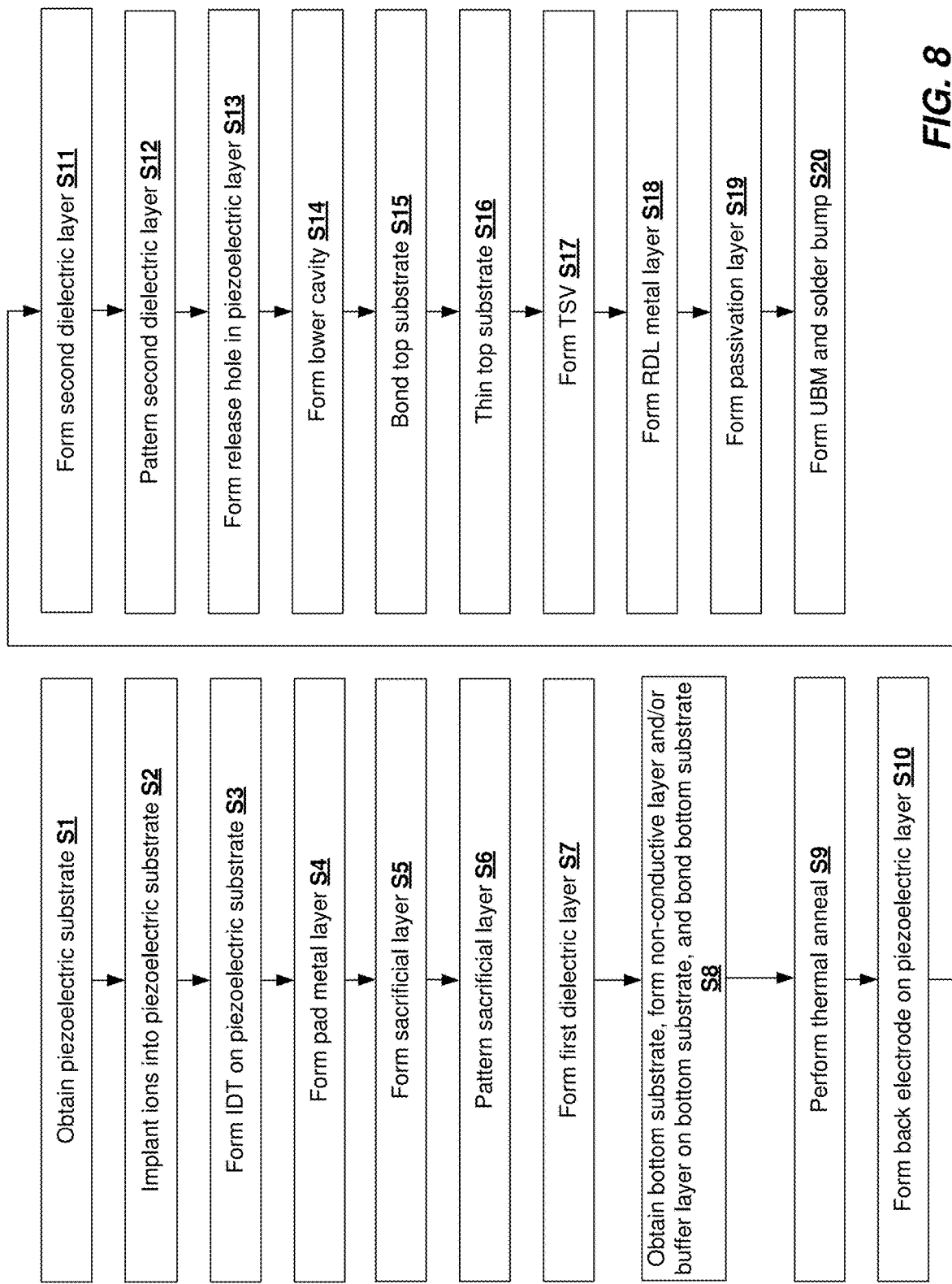
FIG. 8 is a flow chart of a process of fabricating the SAW filter of FIG. 5D, according to an embodiment of the present disclosure.

FIG. 8 is a flow chart of a process of fabricating SAW filter 2001 illustrated FIG. 5D, according to an embodiment of the present disclosure. The process of fabricating SAW filter 2001 as the process of fabricating SAW filter 2000 except that, at step S8, bottom substrate 210 is obtained, at least one of non-conductive layer 320 or buffer layer 330 are deposited on bottom substrate 210, and then bottom substrate 210 deposited with at least one of non-conductive layer 320 or buffer layer 330 is bonded to first dielectric layer 180. When both of non-conductive layer 320 and buffer layer 330 are deposited on bottom substrate 210, non-conductive layer 320 is first deposited on bottom substrate 210, and then buffer layer 330 is deposited on non-conductive layer 320.

Except for step S8, the fabrication process of SAW filter 2001 is the same as that of SAW filter 2000, and therefore detailed descriptions of the other steps of fabricating SAW filter 2001 are not repeated.

In SAW filters 1000, 1001, 2000, and 2001 according to the embodiments of the present disclosure, IDT 130 is provided on one side of piezoelectric layer 140, while back electrode 150 is provided on the opposite side of piezoelectric layer 140. As a result, a higher effective electromechanical coupling coefficient, also referred to as Keff2, of the resonance device can be obtained.

In addition, SAW filters 1000, 1001, 2000, and 2001 according to the embodiments of the present disclosure are provided with a wafer-level packaging (WLP) structure.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A surface acoustic wave (SAW) filter, comprising:
a bottom substrate;
a piezoelectric layer disposed above the bottom substrate, the piezoelectric layer having a bottom surface facing the bottom substrate and a top surface opposite to the bottom surface;
a lower cavity disposed below the piezoelectric layer;
an interdigital transducer (IDT) disposed on the top surface of the piezoelectric layer; and
a back electrode disposed on the bottom surface of the piezoelectric layer,
wherein the back electrode includes a first surface facing the piezoelectric layer, a second surface facing the bottom substrate, and a side surface connecting the first surface and a second surface, and
at least a portion of the side surface of the back electrode is exposed in the lower cavity.

2. The SAW filter of claim 1, further comprising:
a first dielectric layer disposed between the piezoelectric layer and the bottom substrate, and surrounding the lower cavity.

3. The SAW filter of claim 2, wherein
the bottom substrate is formed of Si, $SiO_2$, polysilicon, silicon carbide, sapphire ($Al_2O_3$), or a stacked combination of two or more of those materials, and
the bottom substrate is bonded to the first dielectric layer.

4. The SAW filter of claim 3, further comprising:
a non-conductive layer disposed between the first dielectric layer and the bottom substrate, the non-conductive layer being formed of polysilicon, amorphous silicon, silicon nitride, aluminum nitride, gallium nitride, or a stacked combination of two or more of those materials.

5. The SAW filter of claim 3, further comprising:
a buffer layer disposed between the first dielectric layer and the bottom substrate, the buffer layer being formed of silicon nitride, silicon oxide, or a stacked combination of those materials.

6. The SAW filter of claim 3, further comprising:
a non-conductive layer disposed between the first dielectric layer and the bottom substrate, the non-conductive layer being formed of polysilicon, amorphous silicon, silicon nitride, aluminum nitride, gallium nitride, or a stacked combination of two or more of those materials; and
a buffer layer disposed between the first dielectric layer and the non-conductive layer, the buffer layer being formed of silicon nitride, silicon oxide, or a stacked combination of those materials.

7. The SAW filter of claim 1, further comprising:
an upper cavity disposed above the piezoelectric layer;
a top substrate covering the upper cavity; and
a second dielectric layer disposed between the piezoelectric layer and the top substrate, and surrounding the upper cavity.

8. The SAW filter of claim 7, further comprising:
a pad metal layer disposed above the IDT, a first section of the pad metal layer being disposed above a first input and output end of the IDT, and a second section of the pad metal layer being disposed above a second input and output end of the IDT;
a first through silicon via (TSV) and a second TSV formed in the top substrate and the second dielectric layer, the first TSV exposing the first section of the pad metal layer, and the second TSV exposing the second section of the pad metal layer; and
a redistribution metal layer disposed on the top substrate, a first section of the redistribution metal layer being electrically connected to the first section of the pad metal layer via the first TSV, and a second section of the redistribution metal layer being electrically connected to the second section of the pad metal layer via the second TSV.

9. The SAW filter of claim 8, further comprising:
a first solder bump and a second solder bump disposed above the top substrate, the first solder bump being electrically connected to the first section of the redistribution metal layer, and the second solder bump being electrically connected to the second section of the redistribution metal layer.

10. The SAW filter of claim 8, wherein
the piezoelectric layer includes a back electrode contact hole formed through the piezoelectric layer and exposing a portion of the first surface of the back electrode, and
the pad metal layer includes a third section electrically connected to the exposed portion of the first surface of the back electrode via the back electrode contact hole.

11. The SAW filter of claim 10, wherein
the back electrode contact hole does not overlap with the IDT.

12. The SAW filter of claim 7, wherein
the top substrate is formed of Si, $SiO_2$, polysilicon, silicon carbide, sapphire ($Al_2O_3$), or a stacked combination of two or more of those materials, and
the top substrate is bonded to the second dielectric layer.

* * * * *